United States Patent
Son et al.

(10) Patent No.: US 12,183,286 B2
(45) Date of Patent: Dec. 31, 2024

(54) DISPLAY PANEL

(71) Applicant: Samsung Display Co., Ltd., Yongin-si (KR)

(72) Inventors: Kyoung Seok Son, Yongin-si (KR);
Myeongho Kim, Yongin-si (KR);
Youngoo Kim, Yongin-si (KR);
Jaybum Kim, Yongin-si (KR);
Seunghun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/482,453

(22) Filed: Oct. 6, 2023

(65) Prior Publication Data

US 2024/0221652 A1 Jul. 4, 2024

(30) Foreign Application Priority Data

Dec. 30, 2022 (KR) .................. 10-2022-0190305

(51) Int. Cl.
*G09G 3/3233* (2016.01)
*H10K 59/121* (2023.01)
*H10K 59/123* (2023.01)

(52) U.S. Cl.
CPC ....... *G09G 3/3233* (2013.01); *H10K 59/1213* (2023.02); *H10K 59/123* (2023.02); *G09G 2320/0233* (2013.01)

(58) Field of Classification Search
CPC ......... G09G 3/3233; G09G 2320/0233; H10K 59/1213; H10K 59/123
See application file for complete search history.

(56) References Cited

U.S. PATENT DOCUMENTS

2019/0319083 A1* 10/2019 Pyon .................. H01L 27/124
2021/0111197 A1    4/2021 Moon et al.

FOREIGN PATENT DOCUMENTS

| JP | 2022-042894 A2 | 3/2022 |
| JP | 2022042894 A * | 3/2022 |
| KR | 10-2018-0079082 A | 7/2018 |
| KR | 10-2021-0043771 A | 4/2021 |

* cited by examiner

*Primary Examiner* — Brent D Castiaux
(74) *Attorney, Agent, or Firm* — Lewis Roca Rothgerber Christie LLP

(57) ABSTRACT

Provided is a display panel including a light-emitting element, and a pixel circuit electrically connected to the light-emitting element, and including a driving unit electrically connected to the light-emitting element, the driving unit including a first transistor including a first bottom electrode for receiving a first voltage, and a first semiconductor pattern including an oxide semiconductor above the first bottom electrode, and at least one diode including a second bottom electrode for receiving a second voltage at a same layer as the first bottom electrode, and a second semiconductor pattern above the second bottom electrode, at a same layer as the first semiconductor pattern, including an oxide semiconductor, and integrated with the first semiconductor pattern.

20 Claims, 15 Drawing Sheets

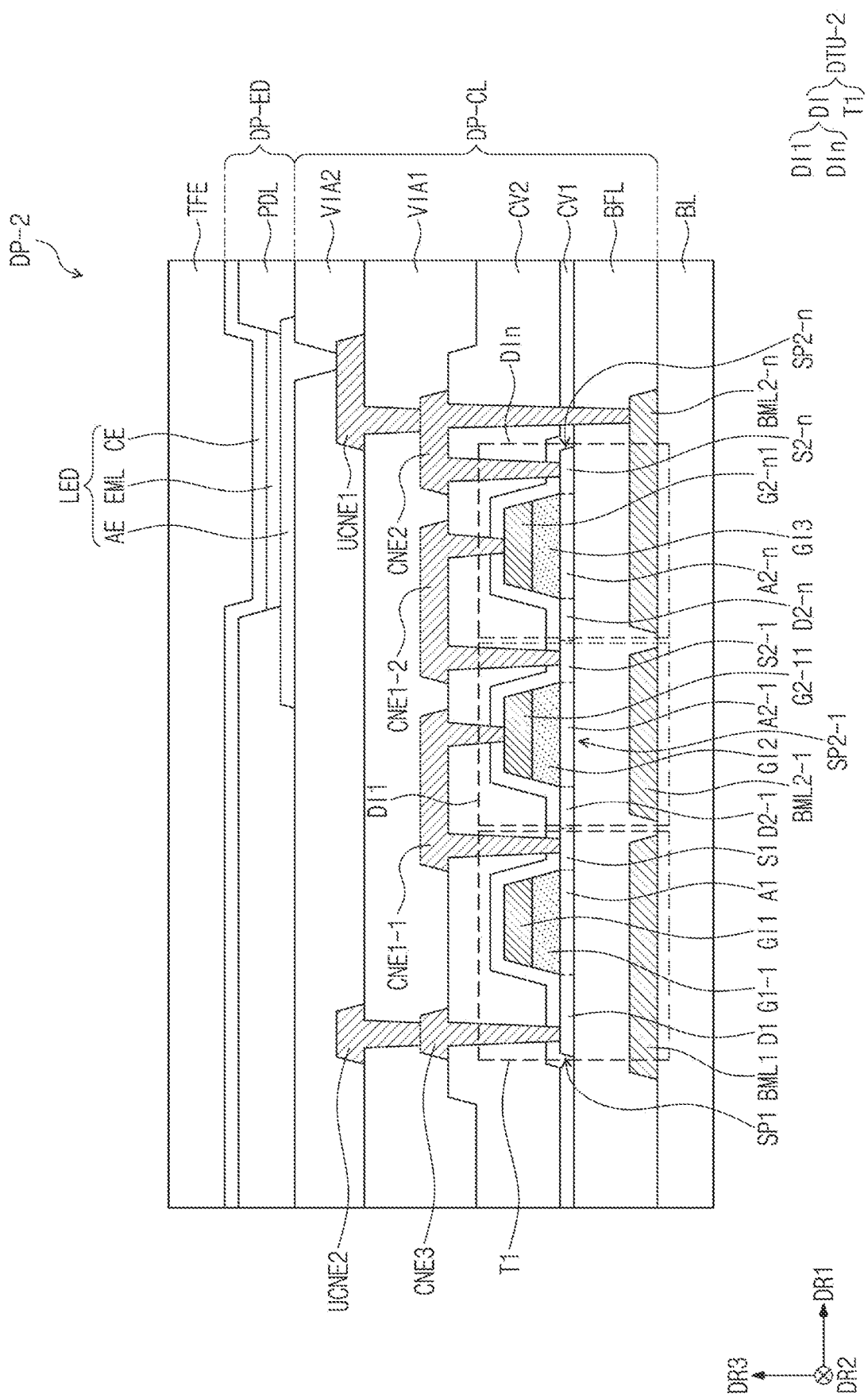

DISPLAY PANEL

CROSS-REFERENCE TO RELATED APPLICATION

This application claims priority to, and the benefit of, Korean Patent Application No. 10-2022-0190305, filed on Dec. 30, 2022, the entire contents of which are hereby incorporated by reference.

BACKGROUND

The present disclosure herein relates to a display panel including a driving unit for driving pixels.

Display devices, such as televisions, mobile phones, tablet computers, navigation units, and game consoles, may include display panels that provide images to users through display screens. The display panels may include light-emitting elements for generating light and pixel circuits for controlling currents that flow through the light-emitting elements. The pixel circuits may include intimately connected transistors, and the transistors may affect driving reliability of the display panels.

SUMMARY

The present disclosure provides a display panel that includes transistors having high-speed driving characteristics, and may reduce or prevent the likelihood of an occurrence of spot defects in a low gray level region and the occurrence of non-uniform luminance.

One or more embodiments of the present disclosure provide a display panel including a light-emitting element, and a pixel circuit electrically connected to the light-emitting element, and including a driving unit electrically connected to the light-emitting element, the driving unit including a first transistor including a first bottom electrode for receiving a first voltage, and a first semiconductor pattern including an oxide semiconductor above the first bottom electrode, and at least one diode including a second bottom electrode for receiving a second voltage at a same layer as the first bottom electrode, and a second semiconductor pattern above the second bottom electrode, at a same layer as the first semiconductor pattern, including an oxide semiconductor, and integrated with the first semiconductor pattern.

The first bottom electrode may be electrically connected to the second semiconductor pattern.

The first bottom electrode may be spaced from the second bottom electrode.

The at least one diode may include a first diode including a second-first bottom electrode for receiving a second-first voltage at the same layer as the first bottom electrode, and a second-first semiconductor pattern including an oxide semiconductor above the second-first bottom electrode and at the same layer as the first semiconductor pattern, and an $n^{th}$ diode including a second-$n^{th}$ bottom electrode for receiving a second-$n^{th}$ voltage at the same layer as the first bottom electrode, and a second-$n^{th}$ semiconductor pattern including an oxide semiconductor above the second-$n^{th}$ bottom electrode and at the same layer as the first semiconductor pattern.

The second-first bottom electrode may be integrated with the second-$n^{th}$ bottom electrode.

The second-first voltage may be equal to the second-$n^{th}$ voltage.

The first bottom electrode may be integrated with the second bottom electrode.

The first transistor may include a first insulating pattern above the first semiconductor pattern, and a first gate electrode above the first insulating pattern, wherein the at least one diode includes a second insulating pattern above the second semiconductor pattern, and a second gate electrode above the second insulating pattern.

The first semiconductor pattern may include a first source region, a first drain region, and a first channel region, wherein the first insulating pattern overlaps the first channel region, but does not overlap the first source region and the first drain region, wherein the second semiconductor pattern includes a second source region, a second drain region, and a second channel region, and wherein the second insulating pattern overlaps the second channel region, but does not overlap the second source region and the second drain region.

An extension length of the first channel region in a first direction may be less than an extension length of the second channel region in the first direction.

The first source region may be electrically connected to the second drain region and to the second gate electrode.

The pixel circuit may further include a first connection electrode connected to the first source region and to the second gate electrode.

The second bottom electrode and the second semiconductor pattern may be electrically connected to the light-emitting element.

The first voltage may be equal to the second voltage.

The pixel circuit may further include at least one cover insulating layer configured to cover the first transistor and the at least one diode, and a connection electrode above the cover insulating layer, passing through at least a portion of the cover insulating layer, and connected to the driving unit.

The light-emitting element may include a first electrode electrically connected to the driving unit, a second electrode above the first electrode, and a light-emitting layer between the first electrode and the second electrode.

The pixel circuit may further include a second transistor including a third semiconductor pattern including an oxide semiconductor at the same layer as the first semiconductor pattern and spaced from the first semiconductor pattern.

In one or more embodiments of the present disclosure, a display panel includes a light-emitting element, and a pixel circuit electrically connected to the light-emitting element, and including a first circuit unit electrically connected to the light-emitting element and including a first transistor including a first bottom electrode for receiving a first voltage, and a first semiconductor pattern including an oxide semiconductor above the first bottom electrode, and at least one diode including a second bottom electrode for receiving a second voltage, electrically connected to the light-emitting element, and at a same layer as the first bottom electrode, and a second semiconductor pattern including an oxide semiconductor, electrically connected to the light-emitting element, and located above the second bottom electrode and at a same layer as the first semiconductor pattern.

The first semiconductor pattern may include a first source region, a first drain region, and a first channel region, wherein the second semiconductor pattern includes a second source region, a second drain region electrically connected to the first source region, and a second channel region.

In one or more embodiments of the present disclosure, a display panel may include a light-emitting element, and a pixel circuit electrically connected to the light-emitting element, and including a first circuit unit electrically connected to the light-emitting element, the first circuit unit including a first transistor including a first bottom electrode for receiving a first voltage, and a first semiconductor pattern including an oxide semiconductor above the first bottom electrode, and at least one diode including a second bottom electrode for receiving a second voltage at a same layer as the first bottom electrode, and a second semiconductor pattern including an oxide semiconductor above the second bottom electrode at a same layer as the first semiconductor pattern, wherein the first bottom electrode is electrically connected to the second bottom electrode or to the second semiconductor pattern.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain aspects of the present disclosure. In the drawings:

FIGS. 3B, 4B, 5B, and 6B are cross-sectional views of display panels according to one or more embodiments of the present disclosure;

DETAILED DESCRIPTION

Figure 1:
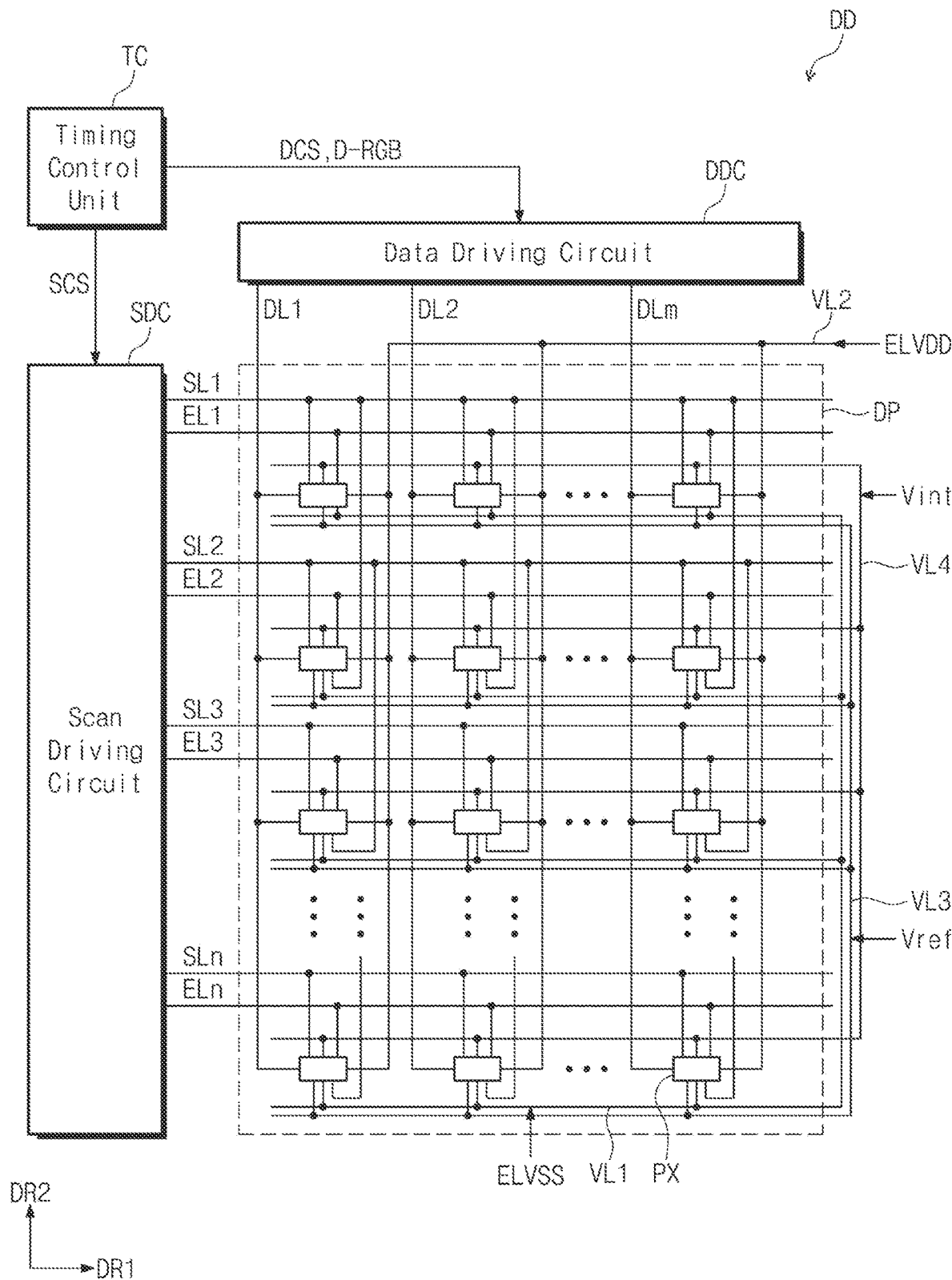
FIG. 1 is a block diagram of a display device according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display panel according to one or more embodiments of the present disclosure will be described with reference to the drawings.

FIG. 1 is a block diagram of a display device DD according to one or more embodiments of the present disclosure.

The display device DD may be a device that is activated in response to an electrical signal and displays an image. For example, the display device DD may include large scale devices, such as a television and an outdoor advertising board, and small-to-medium devices, such as a monitor, a mobile phone, a tablet computer, a navigation unit, and a game console. Here, the embodiments of the display device DD are provided as examples, and are not limited to any one example as long as not departing from the present disclosure.

Referring to FIG. 1, the display device DD includes a timing control unit TC, a scan-driving circuit SDC, a data-driving circuit DDC, and a display panel DP. Each of the timing control unit TC and the data-driving circuit DDC is provided in the form of a driving chip, but may be formed directly on the display panel DP. The present disclosure is not limited thereto.

The timing control unit TC may receive an image input signal, and may generate an image data signal D-RGB that is obtained by converting a data format of the image input signal to satisfy the interface specification with the data-driving circuit DDC. The timing control unit TC may receive a control signal to output a scan control signal SCS and a data control signal DCS. The image input signal and the control signal may be provided from a main controller (or graphic processor).

The data-driving circuit DDC may receive the data control signal DCS and the image data signal D-RGB from the timing control unit TC. The data-driving circuit DDC may convert the image data signal D-RGB into data signals, and may output the data signals to a plurality of data lines DL1 to DLm. The data signals may include analog voltages that correspond to gray level values of the image data signal D-RGB.

The scan-driving circuit SDC may receive the scan control signal SCS from the timing control unit TC. The scan control signal SCS may include a vertical start signal for initiating an operation of the scan-driving circuit SDC and a clock signal for determining output timings of signals, and the like. The scan-driving circuit SDC may generate a plurality of scan signals, and may sequentially output the scan signal to corresponding scan signal lines SL1 to SLn. Also, the scan-driving circuit SDC may generate a plurality of light-emitting control signals in response to the scan control signal SCS, and may output the plurality of light-emitting control signals to corresponding light-emitting signal lines EL1 to ELn.

FIG. 1 shows that the scan signals and the light-emitting control signals are output from a single scan-driving circuit SDC, but the present disclosure is not limited thereto. In the display device DD according to one or more embodiments, the driving circuit for generating and outputting the scan signals may be provided separately from the driving circuit for generating and outputting the light-emitting control signals.

The display panel DP according to one or more embodiments of the present disclosure may include a light emitting-type display panel, but the present disclosure is not particularly limited. For example, the display panel DP may include an organic light-emitting display panel, an inorganic light-emitting display panel, or a quantum-dot light-emitting display panel. A light-emitting layer of the organic light-emitting display panel may include an organic light-emitting material, and a light-emitting layer of the inorganic light-emitting display panel may include an inorganic light-emitting material. A light-emitting layer of the quantum-dot light-emitting display panel may include quantum dots, quantum rods, and the like. Hereinafter, the display panel DP is described as the organic light-emitting display panel.

The display panel DP may include scan signal lines SL1 to SLn, light-emitting signal lines EL1 to ELn, data lines DL1 to DLm, a first voltage line VL1, a second voltage line VL2, a third voltage line VL3, a fourth voltage line VL4, and pixels PX. Unlike that illustrated in FIG. 1, the display panel DP may include a plurality of groups of scan lines.

The scan signal lines SL1 to SLn may extend in a first direction DR1, and may be arranged in a second direction DR2. The light-emitting signal lines EL1 to ELn may extend in the first direction DR1, and may be arranged in the second direction DR2. The data lines DL1 to DLm may intersect with a first group of the scan signal lines SL1 to SLn. The data lines DL1 to DLm may extend in the second direction DR2, and may be arranged in the first direction DR1.

The pixels PX may be electrically connected to the first group of the scan signal lines SL1 to SLn, the light-emitting signal lines EL1 to ELn, and the data lines DL1 to DLm, respectively. The connection relationship between the signal lines illustrated in FIG. 1 is merely an example. The types and numbers of the signal lines connected to the pixels PX are not limited thereto, and the electrical connection relationship between the signal lines may be changed.

The first voltage line VL1 may receive a first source voltage ELVSS. The second voltage line VL2 may receive a second source voltage ELVDD. The second source voltage ELVDD may have a higher level than the first source voltage ELVSS. The third voltage line VL3 may receive a reference voltage Vref. The fourth voltage line VL4 may receive an initialization voltage Vint. Each of the reference voltage Vref and the initialization voltage Vint may have a lower level than the second source voltage ELVDD. The initialization voltage Vint may have a lower level than the reference voltage Vref and the first source voltage ELVSS.

Figure 2A:
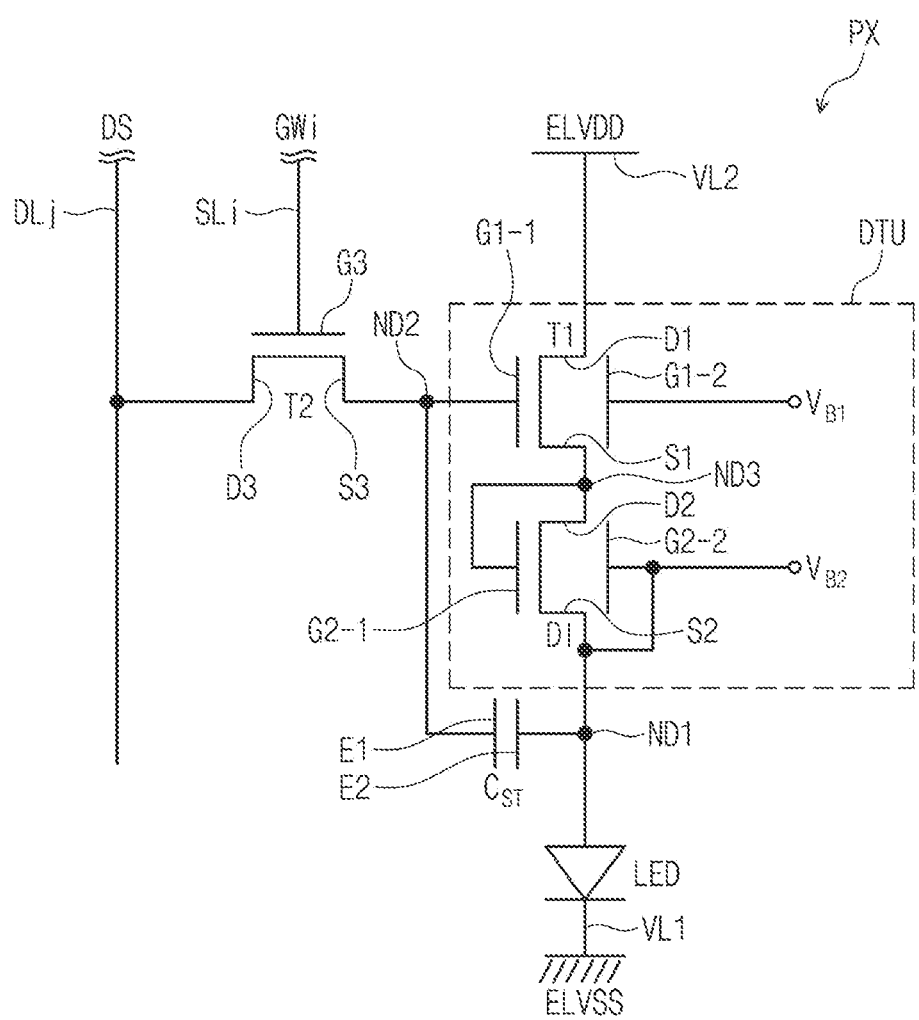
FIG. 2A is an equivalent circuit diagram of a pixel according to one or more embodiments of the present disclosure.

Each of the pixels PX constituting the display panel DP may include a light-emitting element LED (FIG. 2A) and a pixel circuit for controlling light emission of the light-emitting element LED (FIG. 2A). The pixel circuit may include a plurality of transistors and at least one capacitor. At least one of the scan-driving circuit SDC or the data-driving circuit DDC may include transistors that are formed through the same process as the pixel circuits of the pixels PX.

The pixels PX may receive data voltages in response to the scan signals. The pixels PX may emit light, which has luminance corresponding to the data voltages, in response to the light-emitting signals, thereby displaying an image. The light-emitting times of the pixels PX may be controlled by the light-emitting signals. Accordingly, the display panel DP may output the image through the pixels PX.

The pixels PX may include a plurality of groups that generate light having different colors. For example, the pixels PX may include red pixels for generating red light, green pixels for generating green light, and blue pixels for generating blue light. Light-emitting layers of light-emitting elements of the red pixels, light-emitting elements of the green pixels, and light-emitting elements of the blue pixels may include different materials. However, the present disclosure is not necessarily limited thereto.

FIG. 2A is an equivalent circuit diagram of a pixel PX according to one or more embodiments of the present disclosure.

FIG. 2A representatively illustrates a pixel PX that is connected to an $i^{th}$ scan line SLi (or a first scan line) among the scan lines SL1 to SLn (FIG. 1), and is connected to a $j^{th}$ data line DLj (or a first data line) among the data lines DL1 to DLm (FIG. 1).

The pixel circuit may include a plurality of transistors T1 and T2, a storage capacitor $C_{ST}$, and a light-emitting element LED. Each of the plurality of transistors T1 and T2 may include a transistor having an oxide semiconductor layer. The plurality of transistors T1 and T2 may be formed through a low temperature polycrystalline oxide (LTPO) process. The plurality of transistors T1 and T2 are described as N-type transistors. However, the present disclosure is not limited thereto, and at least one of the plurality of transistors T1 or T2 may include a P-type transistor. Also, in one or more embodiments of the present disclosure, at least one of the plurality of transistors T1 or T2 may be omitted, or an additional transistor may be further included in the pixel PX. For example, the pixel circuit may further include a sensing transistor that is connected to the light-emitting signal lines EL1 to ELn (FIG. 1) to receive a plurality of light-emitting control signals.

Each of the plurality of transistors T1 and T2 may include a source, a drain, and a gate. The source, the drain, and the gate may be provided as a source electrode, a drain electrode, and a gate electrode, respectively. As used herein, "being electrically connected between a transistor and a signal line or between a transistor and another transistor" means that "an electrode of the transistor has a shape integrated with the signal line or the other transistor, or is connected thereto via a connection electrode."

The first transistor T1 may be a driving transistor, and the second transistor T2 may be a switching transistor. The first transistor T1 is illustrated as including two gates, and the second transistor T2 is illustrated as including one gate. However, the present disclosure is not limited thereto, and the second transistor T2 may also include two gates.

Also, in the pixel PX according to one or more embodiments, the pixel circuit includes at least one diode DI electrically connected to the first transistor T1. As used herein, the first transistor T1 and at least one diode DI are described as being included in a "driving unit DTU." The driving unit DTU includes the first transistor T1 and at least one diode DI. FIG. 2A illustrates, as an example, that one diode DI is included in the driving unit DTU. However, the present disclosure is not limited thereto, and two or more diodes DI may be included in the driving unit DTU. Also, the driving unit DTU may be referred to as a "first circuit unit."

The light-emitting element LED may include a light-emitting diode. The light-emitting element LED may include a first electrode, a second electrode, and a light-emitting layer located between the first electrode and the second electrode. The first electrode of the light-emitting element LED may be electrically connected to a first node ND1 that is connected to the diode DI, and the second electrode may be electrically connected to the first voltage line VL1 that receives the first source voltage ELVSS.

The driving unit DTU may be electrically connected between the light-emitting element LED and the second voltage line VL2 that receives the second source voltage ELVDD.

The first transistor T1 included in the driving unit DTU may include a first source S1 electrically connected to the diode DI, a first drain D1 electrically connected to the second voltage line VL2, and a first upper gate G1-1 electrically connected to a second node ND2. The first transistor T1 may further include a first lower gate G1-2. The first lower gate G1-2 may be a gate to which a first voltage $V_{B1}$ is applied. In one or more embodiments, the first lower gate G1-2 may be connected to an electrode or to a wire to receive a corresponding constant voltage. For example, the first voltage $V_{B1}$ applied to the first lower gate G1-2 may include the second source voltage ELVDD.

The diode DI included in the driving unit DTU may include a second source S2 electrically connected to the first node ND1, a second drain D2 electrically connected to the first transistor T1 via a third node ND3 between the first transistor T1 and the diode DI, and a second upper gate G2-1 electrically connected to the third node ND3. The diode DI may further include a second lower gate G2-2. The second lower gate G2-2 may be a gate to which a second voltage $V_{B2}$ is applied. In one or more embodiments, the second lower gate G2-2 may be connected to an electrode or a wire to receive a certain constant voltage. For example, the second voltage $V_{B2}$ applied to the second lower gate G2-2 may include the second source voltage ELVDD. Also, the second voltage $V_{B2}$ and the first voltage $V_{B1}$ may be equal to each other.

The driving unit DTU may control a driving current of the light-emitting element LED according to a charging capacity of the storage capacitor $C_{ST}$.

The second transistor T2 may be electrically connected between a data line DLj and the second node ND2. The second transistor T2 may include a third source S3 electrically connected to the second node ND2, a third drain D3 electrically connected to the data line DLj, and a third gate G3 electrically connected to a scan line SLi that receives a first scan signal GWi. In one or more embodiments, the second transistor T2 may further include a second lower gate electrically connected to the second upper gate G2-1. The second transistor T2 may be turned on according to the first scan signal GWi, and may provide a data voltage to the storage capacitor $C_{ST}$ according to a data signal DS transferred from the data line DLj.

In one or more embodiments, the pixel circuit may further include a third transistor and a fourth transistor that receive the reference voltage Vref (FIG. 1) and the initialization voltage Vint (FIG. 1), respectively. The third transistor and the fourth transistor may be connected to the third voltage line VL3 (FIG. 1) and the fourth voltage line VL4 (FIG. 1). The pixel circuit may further include a fifth transistor that is connected to a corresponding light-emitting signal line among the light-emitting signal lines EL1 to ELn (FIG. 1) to receive a light-emitting signal.

With respect to the first transistor T1 and the second transistor T2 included in the pixel PX according to one or more embodiments, the charge carrier mobility in the first transistor T1 may be lower than the charge carrier mobility in the second transistor T2. In one or more embodiments, the mobility of electrons in the first transistor T1 may be lower than the mobility of electrons in the second transistor T2. For example, when charge carriers in the first transistor T1 have a first mobility and the charge carriers in the second transistor T2 have a second mobility, the first mobility may be lower than the second mobility. The driving transistor T1 serves to control the amount of current while the switching transistor T2 has to be quickly turned on and off for high-speed driving. Accordingly, the first mobility may be lower than the second mobility.

The storage capacitor $C_{ST}$ may be electrically connected between the first node ND1 and the second node ND2. The storage capacitor $C_{ST}$ may include a first storage electrode E1 electrically connected to the second node ND2, and a second storage electrode E2 electrically connected to the first node ND1.

Also, the pixel circuit may further include a hold capacitor in addition to the storage capacitor $C_{ST}$. The hold capacitor may be electrically connected between the second voltage line VL2 and the first node ND1.

Each of the pixels PX illustrated in FIG. 1 may include a pixel circuit having the same configuration as the equivalent circuit diagram of the pixel PX illustrated in FIG. 2A. However, the configuration of the pixel PX illustrated in FIG. 2A is merely an example, and the number of transistors and capacitors included in the pixel PX or the connection structure therebetween may be variously changed.

Figure 2B:
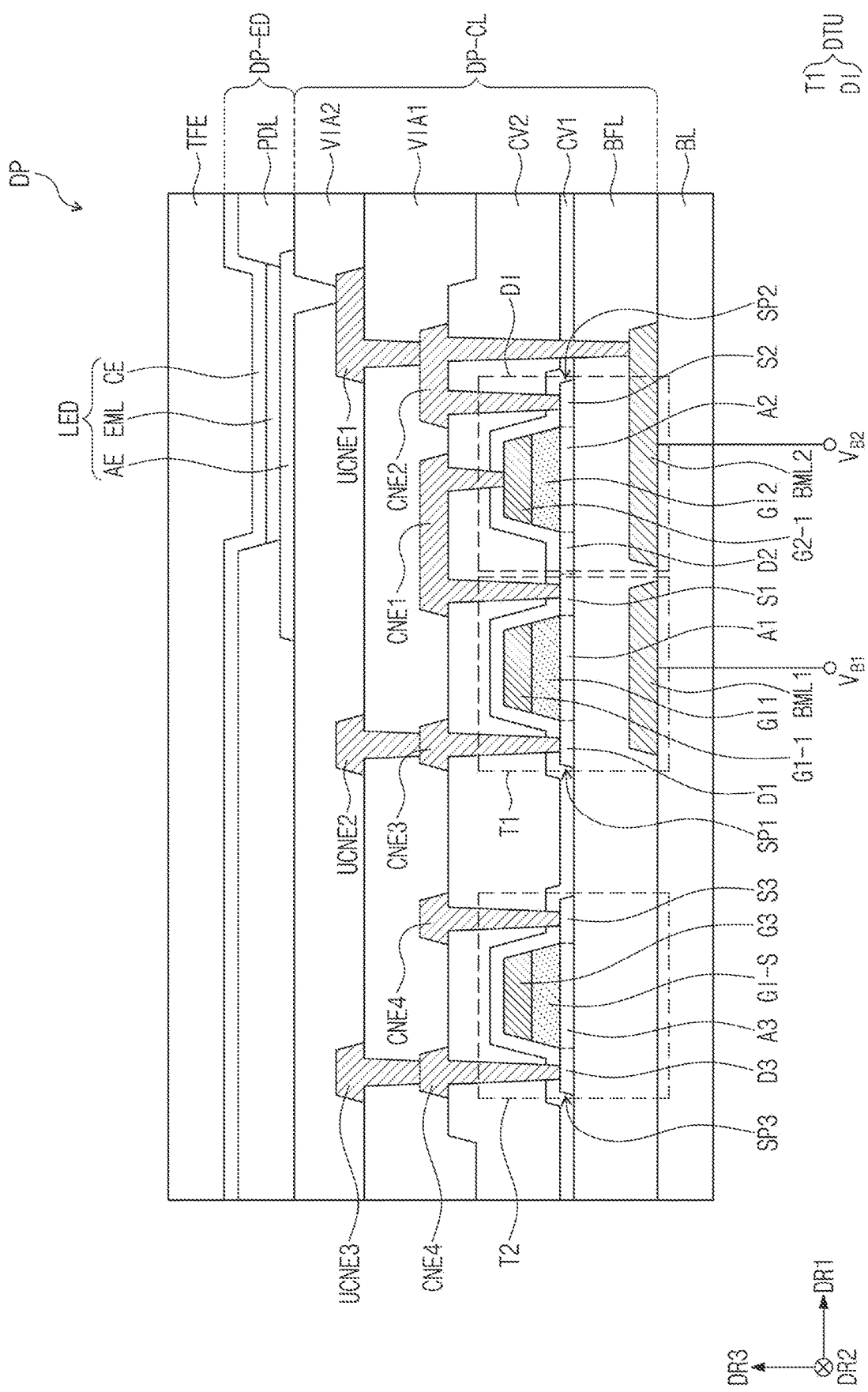
FIG. 2B is a cross-sectional view of a display panel according to one or more embodiments of the present disclosure.

FIG. 2B is a cross-sectional view of a display panel DP according to one or more embodiments of the present disclosure. FIG. 2B illustrates a cross-section of the display panel DP corresponding to one pixel PX illustrated in FIG. 2A.

Referring to FIGS. 2A and 2B together, the display panel DP may include a base layer BL, a circuit element layer DP-CL, a display element layer DP-ED, and an encapsulation layer TFE. In one or more embodiments, the display panel DP according to one or more embodiments may further include one or more functional layers, such as a reflection-preventing layer or a refractive-index-regulating layer, which is located on the encapsulation layer TFE.

Each of the pixels PX included in the display panel DP may include a pixel circuit at the circuit element layer DP-CL, and a light-emitting element LED at the display element layer DP-ED and electrically connected to some components of the pixel circuit. FIG. 2B illustrates the driving unit DTU and the second transistor T2 among the pixel circuit constituting the pixel PX, and a cross-section of the light-emitting element LED connected thereto is illustrated as an example.

The base layer BL may provide a base surface on which the circuit element layer DP-CL is located. The base layer BL may include a glass substrate, a metal substrate, a polymer substrate, or an organic/inorganic composite material substrate.

In one or more embodiments, the base layer BL may include at least one synthetic resin layer. The synthetic resin layer included in the base layer BL may include at least one of an acryl-based resin, a methacryl-based resin, polyisoprene, a vinyl-based resin, an epoxy-based resin, a urethane-based resin, a cellulose-based resin, a siloxane-based resin, a polyamide-based resin, or a perylene-based resin.

The base layer BL may further include a barrier layer that defines an upper surface of the base layer BL. The barrier layer may include at least one inorganic layer that reduces or prevents foreign substances from flowing in from the outside. For example, the barrier layer may include at least one of an aluminum oxide, a titanium oxide, a silicon oxide, a silicon nitride, a silicon oxynitride, a zirconium oxide, or a hafnium oxide.

The circuit element layer DP-CL may be located on the base layer BL. The circuit element layer DP-CL may include transistors T1 and T2, at least one diode DI, and a plurality of insulating layers BFL, CV1, CV2, VIA1, and VIA2, which constitute the pixel circuit of the pixel PX. The plurality of insulating layers BFL, CV1, CV2, VIA1, and VIA2 may include a buffer layer BFL, cover insulating layers CV1 and CV2, and intermediate insulating layers VIA1 and VIA2. However, the number and stacked structure of the insulating layers included in the circuit element layer DP-CL are not limited to the illustrated version.

Through coating or deposition, an insulating layer, a semiconductor layer, and a conductive layer are formed on the base layer BL. Subsequently, the insulating layer, the semiconductor layer, and the conductive layer may be patterned through multiple times of photolithography, thereby forming a semiconductor pattern and a conductive pattern of the circuit element layer DP-CL. Here, the cross-sectional structure of the circuit element layer DP-CL illustrated in FIG. 2B is merely an example, and may vary depending on a manufacturing process of the circuit element layer DP-CL or a configuration of the pixel circuit.

The circuit element layer DP-CL includes a driving unit DTU, and the driving unit DTU includes a first transistor T1 and at least one diode DI. FIGS. 2A and 2B illustrate, as an example, that one diode DI is included in the driving unit DTU.

The first transistor T1 includes a first semiconductor pattern SP1 and a first gate electrode G1-1. The first semiconductor pattern SP1 includes a first source region S1, a first channel region A1, and a first drain region D1. The first transistor T1 may include a first bottom electrode BML1 located below the first semiconductor pattern SP1.

The diode DI includes a second semiconductor pattern SP2 and a second gate electrode G2-1. The second semiconductor pattern SP2 includes a second source region S2, a second channel region A2, and a second drain region D2. The diode DI may include a second bottom electrode BML2 located below the second semiconductor pattern SP2.

The second semiconductor pattern SP2 included in the diode DI may be electrically connected to the first semiconductor pattern SP1 included in the first transistor T1. As illustrated in FIG. 2B, the second semiconductor pattern SP2 may have a shape integrated with the first semiconductor pattern SP1.

The second transistor T2 may include a third semiconductor pattern SP3 and a third gate electrode G3. The third semiconductor pattern SP3 includes a third source region S3, a third channel region A3, and a third drain region D3. In one or more embodiments, the second transistor T2 may further include a third conductive pattern that is located below the third semiconductor pattern SP3. In one or more embodiments, the second transistor T2 may be spaced apart from the first transistor T1 in the first direction DR1.

The buffer layer BFL may be located on the base layer BL. The buffer layer BFL may cover the first bottom electrode BML1 and the second bottom electrode BML2. The buffer layer BFL may enhance bonding strength between the base layer BL and the semiconductor patterns SP1, SP2, and SP3 and/or the bottom electrodes BML1 and BML2. The buffer layer BFL may include at least one inorganic layer. For example, the buffer layer BFL may include at least one of an aluminum oxide, a titanium oxide, a silicon oxide, a silicon nitride, a silicon oxynitride, a zirconium oxide, or a hafnium oxide.

The first semiconductor pattern SP1, the second semiconductor pattern SP2, and the third semiconductor pattern SP3 may be located on the buffer layer BFL. In one or more embodiments, each of the first semiconductor pattern SP1, the second semiconductor pattern SP2, and the third semiconductor pattern SP3 includes an oxide semiconductor. Each of the first semiconductor pattern SP1, the second semiconductor pattern SP2, and the third semiconductor pattern SP3 may include a metal oxide semiconductor material. As each of the first semiconductor pattern SP1, the second semiconductor pattern SP2, and the third semiconductor pattern SP3 includes the metal oxide semiconductor material, electron mobility inside the transistor may be increased, and a leakage current may be reduced. Also, the oxide semiconductors included in the first semiconductor pattern SP1, the second semiconductor pattern SP2, and the third semiconductor pattern SP3 may be the same. However, the present disclosure is not limited thereto, and at least one of the oxide semiconductors included in the first semiconductor pattern SP1, the second semiconductor pattern SP2, or the third semiconductor pattern SP3 may be different from materials of the other oxide semiconductors. For example, the oxide semiconductor included in the third semiconductor pattern SP3 may be different from the oxide semiconductor that is included in each of the first semiconductor pattern SP1 and the second semiconductor pattern SP2.

The metal oxide semiconductor material may include a crystalline or amorphous oxide. For example, the first semiconductor pattern SP1, the second semiconductor pattern SP2, and the third semiconductor pattern SP3 may include metal oxides, such as zinc (Zn), indium (In), gallium (Ga), tin (Sn), and titanium (Ti), or mixtures of metals, such as zinc (Zn), indium (In), gallium (Ga), tin (Sn), and/or titanium (Ti), and/or oxides thereof. In one or more embodiments, the metal oxide semiconductor material may include an indium-tin oxide (ITO), an indium-gallium-zinc oxide (IGZO), a zinc oxide (ZnO), an indium-zinc oxide (IZnO), a zinc-indium oxide (ZIO), an indium oxide (InO), a titanium oxide (TiO), an indium-zinc-tin oxide (IZTO), a zinc-tin oxide (ZTO), etc.

Each of the first semiconductor pattern SP1, the second semiconductor pattern SP2, and the third semiconductor pattern SP3 may include a plurality of regions having different electrical properties. For example, each of the first semiconductor pattern SP1, the second semiconductor pattern SP2, and the third semiconductor pattern SP3 may include a plurality of regions that are divided according to whether the metal oxide is reduced. A region in which the metal oxide is reduced (hereinafter, referred to as a reduction region) may have greater electrical conductivity than a region in which the metal oxide is not reduced (hereinafter, referred to as a non-reduction region). The reduction region may substantially serve as a source region (e.g., the first source region S1), a drain region (e.g., the first drain region D1), or a signal transmission region of the transistor. The non-reduction region may substantially correspond to a channel region (e.g., the first channel region A1) of the transistor.

A source region S1 and a drain region D1 of the first transistor T1 may respectively be a first source and a first drain of the first transistor T1, as described with respect to FIG. 2A. Also, the first source and the first drain of the first transistor T1 may include a source region S1 and a drain region D1 of the first semiconductor pattern SP1 and a connection electrode connected thereto.

The first source region S1 and the first drain region D1 may be spaced apart from each other with the first channel region A1 therebetween. That is, the first source region S1 and the first drain region D1 may extend from the first channel region A1 in directions opposite to each other.

The first bottom electrode BML1 may be located below the first channel region A1 of the first transistor T1. The first bottom electrode BML1 may have a function of a light-blocking pattern. The first bottom electrode BML1 may be spaced apart from the first channel region A1 in the thickness direction with the buffer layer BFL therebetween. The first bottom electrode BML1 may block the light that is incident toward the first semiconductor pattern SP1 from the outside. Therefore, the first bottom electrode BML1 may reduce or prevent the likelihood of external light changing voltage-current characteristics of the first transistor T1.

Also, the first bottom electrode BML1, which overlaps the first channel region A1, may correspond to the first lower gate G1-2 described with respect to FIG. 2A. The first gate electrode G1-1, which overlaps the first channel region A1, may correspond to the first upper gate G1-1 described with respect to FIG. 2A.

A certain voltage is applied to the first bottom electrode BML1. The first bottom electrode BML1 may be connected to an electrode or a wire to receive a certain constant voltage. The first bottom electrode BML1 may receive the first voltage $V_{B1}$. The first voltage $V_{B1}$ applied to the first bottom electrode BML1 may include the second source voltage ELVDD.

Also, the first bottom electrode BML1 may be electrically connected to one of a second bottom electrode BML2 and a second semiconductor pattern SP2 that are described below. As the first bottom electrode BML1 is electrically connected to one of the second bottom electrode BML2 and the second semiconductor pattern SP2, the second bottom electrode BML2 or the second semiconductor pattern SP2 may receive the same voltage applied to the first bottom electrode BML1. A connection relationship between the first bottom electrode BML1 and the second bottom electrode BML2 or the second semiconductor pattern SP2 is described below in the descriptions of FIGS. 2B and 4A to 6B.

A source region S2 and a drain region D2 of the diode DI may be a second source and a second drain of the diode DI, respectively, as described with respect to FIG. 2A. Also, the second source and the second drain of the diode DI may include a source region S2 and a drain region D2 of the second semiconductor pattern SP2 and a connection electrode connected thereto.

The second source region S2 and the second drain region D2 may be spaced apart from each other with the second channel region A2 therebetween. That is, the second source region S2 and the second drain region D2 may extend from the second channel region A2 in directions opposite to each other. The first source region S1 of the first semiconductor pattern SP1 may be connected to the second drain region D2 of the second semiconductor pattern SP2. Accordingly, the second semiconductor pattern SP2 may have a shape integrated with the first semiconductor pattern SP1. The second semiconductor pattern SP2 may be formed through the same process as the first semiconductor pattern SP1, and may include the same material.

The second bottom electrode BML2 may be located below the second channel region A2 of the diode DI. The second electrode BML2 may have a function of a light-blocking pattern. The second bottom electrode BML2 may be spaced apart from the second channel region A2 in the thickness direction with the buffer layer BFL therebetween. The second bottom electrode BML2 may block the light that is incident toward the second semiconductor pattern SP2 from the outside. Therefore, the second bottom electrode BML2 may reduce or prevent the likelihood of external light changing voltage-current characteristics of the diode DI.

Also, the second bottom electrode BML2, which overlaps the second channel region A2, may correspond to the second lower gate G2-2 described with respect to FIG. 2A. The second gate electrode G2-1, which overlaps the second channel region A2, may correspond to the second upper gate G2-1 described with respect to FIG. 2A.

A certain voltage is applied to the second bottom electrode BML2. The second bottom electrode BML2 may be connected to an electrode or a wire to receive a certain constant voltage. The second bottom electrode BML2 may receive the second voltage $V_{B2}$. The second voltage $V_{B2}$ applied to the second bottom electrode BML2 may include the second source voltage ELVDD. The second voltage $V_{B2}$ may be the same as the first voltage $V_{B1}$ applied to the first bottom electrode BML1. Also, the second bottom electrode BML2 may be located on the same layer as the first bottom electrode BML1, and may be formed concurrently or substantially simultaneously through the same process.

A source region S3 and a drain region D3 of the second transistor T2 may be a third source and a third drain of the second transistor T2, respectively, as described with respect to FIG. 2A. The third source and the third drain of the second transistor T2 may include a source region S3 and a drain region D3 of the third semiconductor pattern SP3 and a connection electrode connected thereto.

The third source region S3 and the third drain region D3 may be spaced apart from each other with the third channel region A3 therebetween. That is, the third source region S3 and the third drain region D3 may extend from the third channel region A3 in directions opposite to each other. The third semiconductor pattern SP3 of the second transistor T2 may be spaced apart from the first semiconductor pattern SP1 of the first transistor T1 in the first direction DR1.

In one or more other embodiments, the second transistor T2 may further include a third bottom electrode that is located below the third semiconductor pattern SP3. The third bottom electrode may be located below at least the third channel region A3, and may reduce or prevent the likelihood of external light changing voltage-current characteristics of the second transistor T2. A certain constant voltage may be applied to the third bottom electrode.

Here, FIG. 2B illustrates, as an example, that the first channel region A1 of the first transistor T1, the second channel region A2 of the diode DI, and the third channel region A3 of the second transistor T2 have the same length in the first direction DR1. However, the present disclosure is not limited thereto, and the length of at least one of the first channel region A1, the second channel region A2, or the third channel region A3 in the first direction DR1 may be different from the lengths of the others. For example, the length of the third channel region A3 in the first direction DR1 may be greater than the lengths of the first channel region A1 and/or the second channel region A2 in the first direction DR1. Also, the length of the first channel region A1 in the first direction DR1 may be less than the length of the second channel region A2 in the first direction DR1. That is, the extension length of the channel region of the diode DI in the first direction DR1 may be greater than that of the first transistor T1.

The first transistor T1 may further include a first insulating pattern GI1 located on the first semiconductor pattern SP1. The first insulating pattern GI1 may be located on the first semiconductor pattern SP1 to overlap the first channel region A1 (e.g., while not overlapping the first source region S1 or the first drain region D1). The first gate electrode G1-1 may be located on the first insulating pattern GI1, and may be spaced apart from the first semiconductor pattern SP1 in a third direction DR3. The first gate electrode G1-1 may be located above the first channel region A1, and may overlap the first channel region A1. The first gate electrode G1-1 may define the first channel region A1 of the first transistor T1. That is, the length of the first channel region A1 of the first transistor T1 may substantially correspond to the length of the first gate electrode G1-1.

The diode DI may further include a second insulating pattern GI2 located on the second semiconductor pattern SP2. The second insulating pattern GI2 may be located on the second semiconductor pattern SP2 to overlap the second channel region A2 (e.g., while not overlapping the second source region S2 or the second drain region D2). The second gate electrode G2-1 may be located on the second insulating pattern GI2, and may be spaced apart from the second semiconductor pattern SP2 in the third direction DR3. The second gate electrode G2-1 may be located above the second channel region A2, and may overlap the second channel region A2. The second gate electrode G2-1 may define the second channel region A2 of the diode DI. That is, the length of the second channel region A2 of the diode DI may substantially correspond to the length of the second gate electrode G2-1.

The second transistor T2 may further include an additional insulating pattern GI-S located on the third semiconductor pattern SP3. The additional insulating pattern GI-S may be located on the third semiconductor pattern SP3 to overlap the third channel region A3. The third gate electrode G3 may be located on the additional insulating pattern GI-S, and may be spaced apart from the third semiconductor pattern SP3 in the third direction DR3. The third gate electrode G3 may be located above the third channel region A3, and may overlap the third channel region A3. The third gate electrode G3 may define the third channel region A3 of the second transistor T2. That is, the length of the third channel region A3 of the second transistor T2 may substantially correspond to the length of the third gate electrode G3.

Here, the one insulating layer is formed through a process, and then this insulating layer may be patterned to form the first insulating pattern GI1, the second insulating pattern GI2, and the additional insulating pattern GI-S.

Each of the first insulating pattern GI1, the second insulating pattern GI2, and the additional insulating pattern GI-S may include an inorganic material. For example, each of the first insulating pattern GI1, the second insulating pattern GI2, and the additional insulating pattern GI-S may include at least one of an aluminum oxide, a titanium oxide, a silicon oxide, a silicon nitride, a silicon oxynitride, a zirconium oxide, or a hafnium oxide.

Here, the first insulating pattern GI1, the second insulating pattern GI2, and the additional insulating pattern GI-S are illustrated as having the same thickness. However, the present disclosure is not limited thereto, and at least one of the first insulating pattern GI1, the second insulating pattern GI2, or the additional insulating pattern GI-S may have a thickness that is different from thicknesses of the others. For example, the additional insulating pattern GI-S may have a thickness that is greater than a thickness of each of the first insulating pattern GI1 and the second insulating pattern GI2. Also, the first insulating pattern GI1 may have a thickness that is different from that of the second insulating pattern GI2.

The circuit element layer DP-CL may include one or more cover insulating layers CV1 and/or CV2, which cover each of the first transistor T1, the at least one diode DI, and the second transistor T2. The cover insulating layers CV1 and CV2 may include, for example, a first cover insulating layer CV1 and a second cover insulating layer CV2.

The first cover insulating layer CV1 may be located on the buffer layer BFL. Referring to FIG. 2B, the first cover insulating layer CV1 may be located to cover each of the first semiconductor pattern SP1 to the third semiconductor pattern SP3 and the first gate electrode G1-1 to the third gate electrode G3. However, the present disclosure is not limited thereto. For example, the first cover insulating layer CV1 may be patterned to cover the first semiconductor pattern SP1 to the third semiconductor pattern SP3 while not covering the first gate electrode G1-1 to the third gate electrode G3.

The first cover insulating layer CV1 may include at least one inorganic layer. For example, the first cover insulating layer CV1 may include at least one of an aluminum oxide, a titanium oxide, a silicon oxide, a silicon nitride, a silicon oxynitride, a zirconium oxide, or a hafnium oxide. However, the material of the first cover insulating layer CV1 is not limited to the above examples.

The second cover insulating layer CV2 is located on the first cover insulating layer CV1, and may cover the transistors T1 and T2 and the at least one diode DI. The second cover insulating layer CV2 may include at least one inorganic layer. For example, the second cover insulating layer CV2 may include at least one of an aluminum oxide, a titanium oxide, a silicon oxide, a silicon nitride, a silicon oxynitride, a zirconium oxide, or a hafnium oxide.

At least one contact hole is provided in the second cover insulating layer CV2, and connection electrodes CNE1, CNE2, CNE3, and CNE4 may be connected to portions of the first transistor T1, the second transistor T2, and the at least one diode DI, via the contact hole. The connection electrodes CNE11, CNE2, CNE3, and CNE4 may pass through at least portions of the first cover insulating layer CV1 and the second cover insulating layer CV2, and may be respectively connected to the driving unit DTU, which includes the first transistor T1 and the at least one diode DI, and to the second transistor T2. The connection electrodes CNE1, CNE2, CNE3, and CNE4 may be respectively electrically connected to the source region, the drain region, the gate electrode, and the like of each of the first transistor T1, the second transistor T2, and the at least one diode DI. For example, a first connection electrode CNE1 connects the first source region S1 of the first transistor T1 and the second gate electrode G2-1 of the diode DI to each other. A second connection electrode CNE2 is connected to each of the second source region S2 and the second bottom electrode BML2 of the diode DI. A third connection electrode CNE3 is connected to the first drain region D1 of the first transistor T1. A fourth connection electrode CNE4 is connected to each of the third source region S3 and the third drain region D3 of the second transistor T2. The connection electrodes CNE1, CNE2, CNE3, and CNE4 are arranged on one of the cover insulating layers CV1 and CV2, and may be respectively electrically connected to the source region, the drain region, the gate electrode, and the like of each of the first transistor T1, the second transistor T2, and the at least one diode DI, via the contact holes that pass through at least portions of the cover insulating layers CV1 and CV2.

The circuit element layer DP-CL may include intermediate insulating layers VIA1 and VIA2 arranged above the cover insulating layers CV1 and CV2. The intermediate insulating layers VIA1 and VIA2 may include, for example, a first intermediate insulating layer VIA1 and a second intermediate insulating layer VIA2.

The first intermediate insulating layer VIA1 may cover the connection electrodes CNE1, CNE2, CNE3, and CNE4, and may be located on the second cover insulating layer CV2. The first intermediate insulating layer VIA1 may include at least one of an inorganic layer or an organic layer, and may have a single-layer or multi-layer structure. The first intermediate insulating layer VIA1 may include, for example, an organic layer. As the first intermediate insulating layer VIA1 includes an organic layer, a curved upper surface of components arranged below the first intermediate insulating layer VIA1 may be covered, and a flat upper surface may be provided.

At least one contact hole is provided in the first intermediate insulating layer VIA1, and upper connection electrodes UCNE1, UCNE2, and UCNE3 may be respectively connected to portions of the connection electrodes CNE1, CNE2, CNE3, and CNE4 via the at least one contact hole. The upper connection electrodes UCNE1, UCNE2, and UCNE3 pass through the first intermediate insulating layer VIA1, and may be respectively connected to portions of the connection electrodes CNE1, CNE2, CNE3, and CNE4.

For example, a first upper connection electrode UCNE1 is connected to the second connection electrode CNE2, a second upper connection electrode UCNE2 is connected to the third connection electrode CNE3, and a third upper connection electrode UCNE3 is connected to the fourth connection electrode CNE4. The second upper connection electrode UCNE2 is electrically connected to the first drain region D1 of the first transistor T1, and may be electrically connected to the second voltage line VL2 illustrated in FIG. 2A, and may receive the second source voltage ELVDD. The third upper connection electrode UCNE3 is electrically connected to the third drain region D3 of the second transistor T2, and may be electrically connected to the data line DLj illustrated in FIG. 2A to receive the data voltage.

The second intermediate insulating layer VIA2 is located on the first intermediate insulating layer VIA1, and may cover the upper connection electrodes UCNE1, UCNE2, and UCNE3. The second intermediate insulating layer VIA2 may include at least one of an inorganic layer or an organic layer, and may have a single-layer or multi-layer structure. The second intermediate insulating layer VIA2 may include, for example, an organic layer. As the second intermediate insulating layer VIA2 includes an organic layer, a curved upper surface of components arranged below the second intermediate insulating layer VIA2 may be covered, and a flat upper surface may be provided.

The display element layer DP-ED may be located on the circuit element layer DP-CL. The display element layer DP-ED may include a light-emitting element LED and a pixel-defining layer PDL. The light-emitting element LED may include a first electrode AE, a second electrode CE, and a light-emitting layer EML. In one or more embodiments, the first electrode AE of the light-emitting element LED may be an anode, and the second electrode CE may be a cathode.

The first electrode AE of the light-emitting element LED and the pixel-defining layer PDL may be located on the second intermediate insulating layer VIA2. The first electrode AE may be connected to the first upper connection electrode UCNE1 via at least a contact hole that passes through the second intermediate insulating layer VIA2. As the first electrode AE is connected to the first upper connection electrode UCNE1, the first electrode AE may be electrically connected to each of the second source region S2 and the second bottom electrode BML2 of the diode DI via the first upper connection electrode UCNE1 and the second connection electrode CNE2. That is, the first electrode AE of the light-emitting element LED may be electrically connected to each of the second semiconductor pattern SP2 and the second bottom electrode BML2 of the diode DI.

A light-emitting opening, through which at least a portion of the first electrode AE is exposed, may be defined in the pixel-defining layer PDL. The portion of the first electrode AE, which is exposed through the light-emitting opening, may correspond to a light-emitting region.

The pixel-defining layer PDL may include a polymer resin and may further include an inorganic material included in the polymer resin. In one or more embodiments, the pixel-defining layer PDL may have a certain color. For example, the pixel-defining layer PDL may include a base resin and a black pigment and/or black dye mixed with the base resin. However, the pixel-defining layer PDL is not limited thereto.

The second electrode CE may be located facing the first electrode AE. The second electrode CE may be located in common in the pixels PX (FIG. 1). That is, the second electrode CE may be a common electrode commonly provided in the plurality of pixels PX (FIG. 1).

The light-emitting layer EML may be located between the first electrode AE and the second electrode CE. The light-emitting layer EML may include an organic material and/or an inorganic material. The light-emitting layer EML may be located as a pattern in a region that corresponds to the light-emitting opening defined in the pixel-defining layer PDL. The light-emitting layer EML may generate one of red, green, and blue light. However, the present disclosure is not limited thereto, and the light-emitting layer EML may be located in common for the pixels PX (FIG. 1), and may generate blue light or white light. FIG. 2B illustrates, as an example, that the light-emitting element LED includes one light-emitting layer EML, but the present disclosure is not limited thereto. The light-emitting element LED may include a tandem light-emitting element that includes a stack provided with a plurality of light-emitting layers.

The light-emitting element LED may further include at least one function layer that is provided between the light-emitting layer EML and each of the first electrode AE and the second electrode CE. The light-emitting element LED may further include, for example, a hole control layer, which is provided between the first electrode AE and the light-emitting layer EML, and an electron control layer, which is provided between the second electrode CE and the light-emitting layer EML. Each of the hole control layer and the electron control layer may be located in common for the pixels PX (FIG. 1). The hole control layer may include at least one of a hole injection layer, a hole transport layer, or an electron-blocking layer. The electron control layer may include at least one of an electron injection layer, an electron transport layer, or a hole-blocking layer.

The first source voltage ELVSS (FIG. 2A) may be applied to the second electrode CE, and the second source voltage ELVDD (FIG. 2A) may be applied to the first electrode AE. A hole and an electron injected into the light-emitting layer EML are coupled to each other and form an exciton, and while the exciton is transited to a ground state, the light-emitting element LED may emit light.

The encapsulation layer TFE may be located on the display element layer DP-ED, and may seal the light-emitting element LED. The encapsulation layer TFE may include a plurality of thin films. For example, the encapsulation layer TFE may include inorganic films and an organic film located between the inorganic films. The thin films of the encapsulation layer TFE may be located to enhance optical efficiency of the light-emitting element LED or to protect the light-emitting element LED. The inorganic film may protect the light-emitting element LED from moisture and/or oxygen, and the organic film may protect the light-emitting element LED from foreign substances, such as dust particles.

In the display panel DP according to one or more embodiments of the present disclosure, the driving unit DTU includes the first transistor T1 and the at least one diode DI. The first transistor T1 and the at least one diode DI include the semiconductor patterns SP1 and SP2 and the bottom electrodes BML1 and BML2, respectively. The bottom electrodes BML1 and BML2 have a structure to which a certain voltage is applied. Accordingly, it is possible to enlarge the driving range of the driving unit DTU, thereby reducing or preventing the occurrence of spot defects in the low gray level region.

When the driving unit DTU includes only the first transistor T1 that includes the first semiconductor pattern SP1 containing an oxide semiconductor, the oxide semiconductor has a low subthreshold swing value due to a low threshold voltage, and thus, a driving range in a low gray level region becomes narrowed. Accordingly, spot defects in the low gray level region may be easily viewed, and non-uniform luminance may occur. For example, when the carrier mobility of the second transistor T2 is increased to enhance on/off characteristics of the second transistor T2, which is a switching transistor, the visible spot defects in the low gray level region and the non-uniform luminance may be aggravated.

The driving unit DTU according to one or more embodiments of the present disclosure includes the first transistor T1 and the at least one diode DI. The diode DI includes the second semiconductor pattern SP2, which has a shape that is integrated with the first semiconductor pattern SP1 and that is electrically connected thereto, and also includes the second bottom electrode BML2, which is located on the same layer as the first bottom electrode BML1 and to which a certain voltage is applied. Accordingly, it is possible to enlarge the driving range in the low gray level region, and to regulate the driving range and the threshold voltage, thereby reducing or preventing the spot defects in the low gray level region, and also reducing or preventing the non-uniform luminance. The driving unit DTU according to one or more embodiments has a structure in which the second semiconductor pattern SP2 of the diode DI is electrically connected to the first semiconductor pattern SP1 of the first transistor T1, thereby increasing resistance and enlarging the driving range. Also, the driving unit DTU is designed to have a structure in which each of the second bottom electrode BML2 and the second semiconductor pattern SP2 of the diode DI is electrically connected to the first electrode AE of the light-emitting element LED, thereby further enlarging the driving range. In addition, as the voltage applied to the second bottom electrode BML2 is regulated, the driving range and the threshold voltage may be regulated.

FIGS. 3A, 4A, 5A, and 6A are equivalent circuit diagrams of pixels according to one or more embodiments of the present disclosure. FIGS. 3B, 4B, 5B, and 6B are cross-sectional views of display panels according to one or more embodiments of the present disclosure. FIGS. 3A, 4A, 5A, and 6A illustrate equivalent circuit diagrams of pixels according to embodiments different from the pixel PX illustrated in FIG. 2A, and FIGS. 3B, 4B, 5B, and 6B illustrate cross-sections of display panels in pixels corresponding to FIGS. 3A, 4A, 5A, and 6A, respectively. Hereinafter, when describing pixels and display panels according to other embodiments with reference to FIGS. 3A to 6B, the same reference symbols are given to components that are the same as those described with respect to FIGS. 2A and 2B, and their repeated detailed descriptions may be omitted.

Figure 3A:
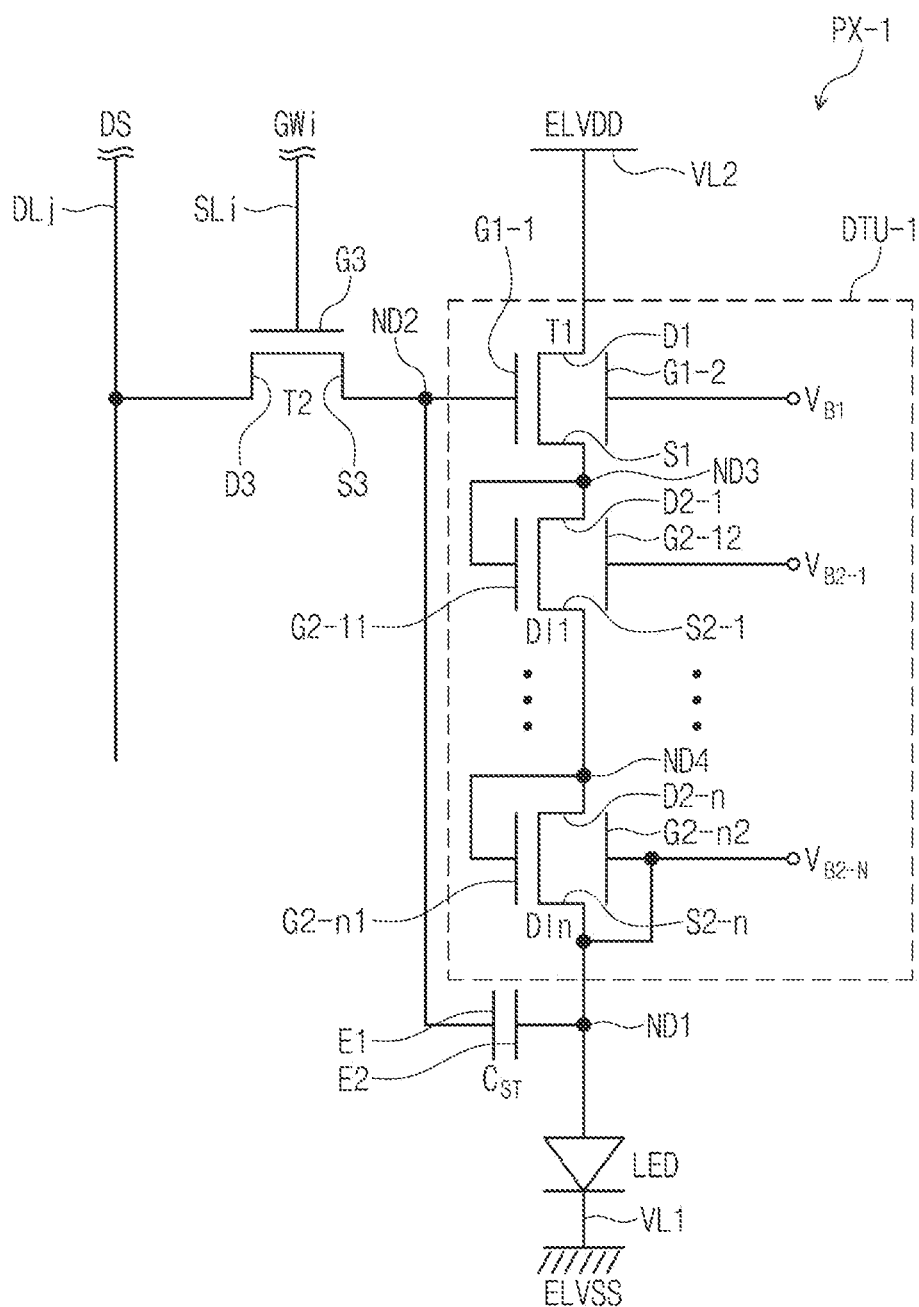
FIGS. 3A, 4A, 5A, and 6A are equivalent circuit diagrams of pixels according to one or more embodiments of the present disclosure.
Figure 3B:
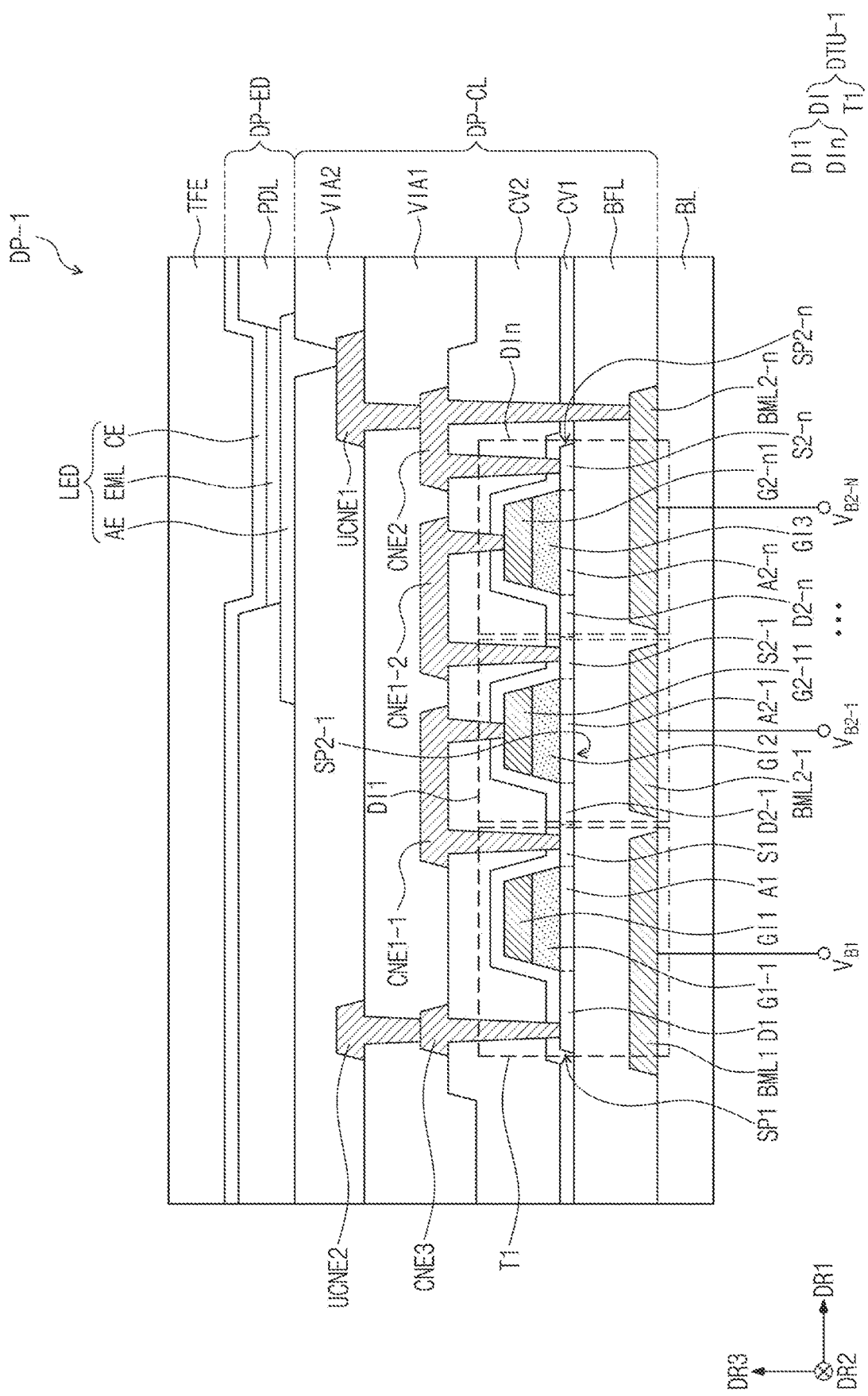

Referring to FIGS. 3A and 3B together, a display panel DP-1 having a pixel PX-1 according to one or more embodiments includes a driving unit DTU-1. The driving unit DTU-1 may include a first transistor T1 and a plurality of diodes DI1 to DIn. The driving unit DTU-1 may include one first transistor T1 and n diodes DI1 to DIn. For convenience of illustration, FIG. 3B illustrates, as an example, that the driving unit DTU-1 includes two diodes. However, the present disclosure is not limited thereto, and the driving unit DTU-1 may include three or more diodes. FIGS. 3A and 3B illustrate, as an example, an arrangement relationship of a first diode DI1 and an $n^{th}$ diode DIn that are included in the driving unit DTU-1, but one or more diodes may be further provided between the first diode DI1 and the $n^{th}$ diode DIn.

Referring to FIG. 3A, the plurality of diodes DI1 to DIn may include second drains D2-1 and D2-$n$, second sources S2-1 and S2-$n$, second upper gates G2-11 and G2-$n$1, and second lower gates G2-12 and G2-$n$2, respectively. For example, the first diode DI1 may include a second-first drain D2-1, which is electrically connected to the first transistor T1, a second-first source S2-1, which is electrically connected to the $n^{th}$ diode DIn, and a second-first upper gate G2-11 and a second-first lower gate G2-12, which are electrically connected to a third node ND3.

The $n^{th}$ diode DIn may include a second-$n^{th}$ drain D2-$n$, which is electrically connected to the first diode DI1, a second-$n^{th}$ source S2-$n$, which is electrically connected to a first node ND1, and a second-$n^{th}$ upper gate G2-$n$1 and a second-$n^{th}$ lower gate G2-$n$2, which are electrically connected to a fourth node ND4. Here, the fourth node ND4 may be provided between the plurality of diodes DI1 to DIn.

The second lower gates G2-12 and G2-$n$2 may be gates to which second voltages $V_{B2-1}$ and $V_{B2-n}$ are respectively applied. In one or more embodiments, a second-first lower gate G2-12 may receive a second-first voltage $V_{B2-1}$, and a second-$n^{th}$ lower gate G2-$n$2 may receive a second-$n^{th}$ voltage $V_{B2-n}$. The voltages applied to the plurality of second lower gates G2-12 and G2-$n$2 may be equal to each other. For example, both the second-first voltage $V_{B2-1}$ and the second-$n^{th}$ voltage $V_{B2-n}$ may be the second source voltage ELVDD. Also, each of the second-first voltage $V_{B2-1}$ and the second-$n^{th}$ voltage $V_{B2-n}$ may be equal to a first voltage $V_{B1}$.

Referring to FIGS. 3A and 3B together, the first transistor T1 and the plurality of diodes DI1 to DIn, which are included in the driving unit DTU-1, may include semiconductor patterns SP1, SP2-1, and SP2-$n$, gate electrodes G1-1, G2-11, and G2-$n$1, and bottom electrodes BML1, BML2-1, and BML2-$n$, respectively. The first transistor T1 may include the first semiconductor pattern SP1, the first gate electrode G1-1, and the first bottom electrode BML1. The first diode DI1 may include the second-first semiconductor pattern SP2-1, the second-first gate electrode G2-11, and the second-first bottom electrode BML2-1. The $n^{th}$ diode DIn may include the second-$n^{th}$ semiconductor patterns SP2-$n$, the second-$n^{th}$ gate electrode G2-$n$1, and the second-$n^{th}$ bottom electrode BML2-$n$.

The second semiconductor patterns SP2-1 and SP2-$n$ respectively included in the plurality of diodes DI1 to DIn may be electrically connected to the first semiconductor pattern SP1 included in the first transistor T1. As illustrated in FIG. 3B, each of the second-first semiconductor pattern SP2-1 of the first diode DI1 and the second-$n^{th}$ semiconductor pattern SP2-$n$ of the $n^{th}$ diode DIn may have a shape integrated with the first semiconductor pattern SP1. That is, a first source region S1 of the first semiconductor pattern SP1 may be connected to a second-first drain region D2-1 of the second-first semiconductor pattern SP2-1, and the second-first source region S2-1 of the second-first semiconductor pattern SP2-1 may be connected to the second-$n^{th}$ drain region D2-$n$ of the second-$n^{th}$ semiconductor pattern SP2-$n$. Accordingly, each of the second-first semiconductor pattern SP2-1 and the second-$n^{th}$ semiconductor pattern SP2-$n$ may have a shape integrated with the first semiconductor pattern SP1. Each of the second-first semiconductor pattern SP2-1 and the second-$n^{th}$ semiconductor pattern SP2-$n$ may be formed through the same process as the first semiconductor pattern SP1, and may include the same material.

The second-first source region S2-1 and the second-first drain region D2-1 may be spaced apart from each other with a second-first channel region A2-1 therebetween. That is, the second-first source region S2-1 and the second-first drain region D2-1 may extend from the second-first channel region A2-1 in directions opposite to each other. The second-$n^{th}$ source region S2-$n$ and the second-$n^{th}$ drain region D2-$n$ may be spaced apart from each other with a second-$n^{th}$ channel region A2-$n$ therebetween. That is, the second-$n^{th}$ source region S2-$n$ and the second-$n^{th}$ drain region D2-$n$ may extend from the second-$n^{th}$ channel region A2-$n$ in directions opposite to each other.

The second bottom electrodes BML2-1 and BML2-$n$ may be located below the second channel regions A2-1 and A2-$n$ of the plurality of diodes DI1 to DIn, respectively. The second bottom electrodes BML2-1 and BML2-$n$ may be respectively spaced apart from the second channel regions A2-1 and A2-$n$ in the thickness direction with a buffer layer BFL therebetween. The second bottom electrodes BML2-1 and BML2-$n$ may block the light that is incident toward the second semiconductor pattern SP2-1 and SP2-$n$ from the outside. The second-first bottom electrode BML2-1, which overlaps the second-first channel region A2-1, may be located below the second-first semiconductor pattern SP2-1, and the second-$n^{th}$ bottom electrode BML2-$n$, which overlaps the second-$n^{th}$ channel region A2-$n$, may be located below the second-$n^{th}$ semiconductor pattern SP2-$n$.

Also, the second-first bottom electrode BML2-1, which overlaps the second-first channel region A2-1, may correspond to the second lower gate G2-12 described with respect to FIG. 3A. The second-first gate electrode G2-11, which overlaps the second-first channel region A2-1, may correspond to the second upper gate G2-11 described with respect to FIG. 3A. The second-$n^{th}$ bottom electrode BML2-$n$, which overlaps the second-$n^{th}$ channel region A2-$n$, may correspond to the second lower gate G2-$n$2 described with respect to FIG. 3A. The second-$n^{th}$ gate electrode G2-$n$1, which overlaps the second-$n^{th}$ channel region A2-$n$, may correspond to the second upper gate G2-$n$1 described with respect to FIG. 3A.

A certain voltage is applied to each of the second bottom electrode BML2-1 and BML2-$n$. The second bottom electrodes BML2-1 and BML2-$n$ may be respectively connected to an electrode or a wire to receive a constant voltage. The second bottom electrodes BML2-1 and BML2-$n$ may receive second voltages $V_{B2-1}$ and $V_{B2-n}$. The second-first bottom electrode BML2-1 may receive the second-first voltage $V_{B2-1}$, and the second-$n^{th}$ bottom electrode BML2-$n$ may receive the second-$n^{th}$ voltage $V_{B2-n}$. The voltages applied to the plurality of second bottom electrodes BML2-1 and BML2-$n$ may be equal to each other. For example, both the second-first voltage $V_{B2-1}$ and the second-$n^{th}$ voltage $V_{B2-n}$ may be the second source voltage ELVDD. Also, each of the second-first voltage $V_{B2-1}$ and the second-$n^{th}$ voltage $V_{B2-n}$ may be equal to a first voltage $V_{B1}$. Also, each of the second bottom electrodes BML2-1 and BML2-$n$ may be located on the same layer as the first bottom electrode BML1, and may be formed concurrently or substantially simultaneously through the same process.

The first diode DI1 may further include a second insulating pattern GI2 located on the first-second semiconductor pattern SP2-1. The second insulating pattern GI2 may be located on the second-first semiconductor pattern SP2-1 to overlap the second-first channel region A2-1. The second-first gate electrode G2-11 may be located on the second insulating pattern GI2, and may be spaced apart from the second-first semiconductor pattern SP2-1 in the third direction DR3. The second-first gate electrode G2-11 may be located above the second-first channel region A2-1, and may overlap the second-first channel region A2-1. The second-first gate electrode G2-11 may define the second-first channel region A2-1 of the first diode DI1.

The $n^{th}$ diode DI$n$ may further include a third insulating pattern GI3 located on the second-$n^{th}$ semiconductor pattern SP2-$n$. The third insulating pattern GI3 may be located on the second-$n^{th}$ semiconductor pattern SP2-$n$ to overlap the second-$n^{th}$ channel region A2-$n$. The second-$n^{th}$ gate electrode G2-$n$1 may be located on the third insulating pattern GI3, and may be spaced apart from the second-$n^{th}$ semiconductor pattern SP2-$n$ in the third direction DR3. The second-$n^{th}$ gate electrode G2-$n$1 may be located above the second-$n^{th}$ channel region A2-$n$, and may overlap the second-$n^{th}$ channel region A2-$n$. The second-$n^{th}$ gate electrode G2-$n$1 may define the second-$n^{th}$ channel region A2-$n$ of the $n^{th}$ diode DI$n$.

As the driving unit DTU-1 includes the plurality of diodes DI1 to DI$n$, connection electrodes CNE1-1, CNE1-2, CNE2, and CNE3, which pass through at least portions of cover insulating layers CV1 and CV2, may include at least one connection electrode that electrically connects the first transistor T1 and the plurality of diodes DI1 to DI$n$. In one or more embodiments, a first-first connection electrode CNE1-1 connects the first source region S1 of the first transistor T1 and the second-first gate electrode G2-11 of the first diode DI1 to each other. A first-second connection electrode CNE1-2 connects the second-first source region S2-1 of the first diode DI1 and the second-$n^{th}$ gate electrode G2-$n$1 of the $n^{th}$ diode DI$n$ to each other.

A second connection electrode CNE2 may be connected to a semiconductor pattern and to a bottom electrode of the last diode among the plurality of diodes DI1 to DI$n$. In one or more embodiments, the second connection electrode CNE2 may be electrically connected to a second-$n^{th}$ semiconductor pattern SP2-$n$ and a second-$n^{th}$ bottom electrode BML2-$n$ of the $n^{th}$ diode DI$n$ that is farthest from the first transistor T1. A first electrode AE of the light-emitting element LED may be electrically connected to each of the second-$n^{th}$ semiconductor pattern SP2-$n$ and the second-$n^{th}$ bottom electrode BML2-$n$ of the $n^{th}$ diode DI$n$, via a first upper connection electrode UCNE1 and the second connection electrode CNE2. The display panel DP-1 including the driving unit DTU-1 according to one or more embodiments includes the first transistor T1 and the plurality of diodes DI1 to DI$n$, thereby increasing resistance and enlarging the driving range. Also, the driving unit DTU-1 is designed to have a structure in which each of the second-$n^{th}$ semiconductor pattern SP2-$n$ and the second-$n^{th}$ bottom electrode BML2-$n$ of the $n^{th}$ diode DI$n$, which is the last diode among the plurality of diodes DI1 to DI$n$, is electrically connected to the first electrode AE of the light-emitting element LED, thereby further enlarging the driving range. In addition, as the voltage applied to the second-$n^{th}$ bottom electrode BML2-$n$ is regulated, the driving range and the threshold voltage may be regulated.

FIGS. 4A and 4B, FIGS. 5A and 5B, and FIGS. 6A and 6B respectively illustrate driving units DTU-2, DTU-3, and DTU-4, and pixels PX-2, PX-3, and PX-4 and display panels DP-2, DP-3, and DP-4 including the same, according to other embodiments. These driving units include a plurality of diodes DI1 to DI$n$ like the driving unit DTU-1 illustrated in FIGS. 3A and 3B, but a connection relationship of a first transistor T1 and a plurality of diodes DI1 to DI$n$ included in each of the driving units is somewhat different from that of the driving unit DTU-1.

Figure 4A:
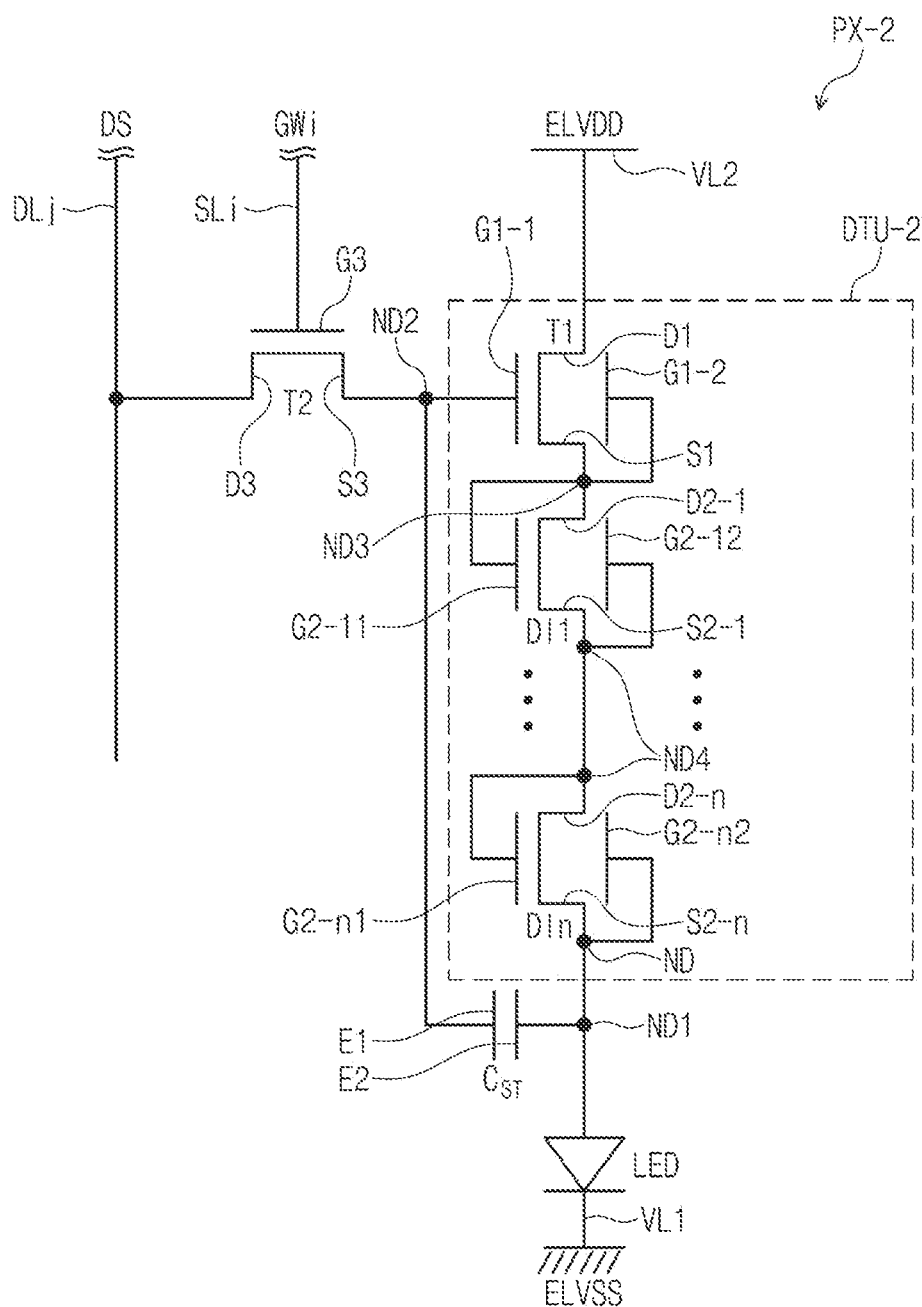

When examining a pixel PX-2 and a display panel DP-2 including a driving unit DTU-2 illustrated in FIGS. 4A and 4B, a first lower gate G1-2 included in a first transistor T1 of the driving unit DTU-2 is connected to a third node ND3, and may be electrically connected to a second-first drain D2-1 of a first diode DI1. A second-first lower gate G2-12 included in the first diode DI1 of the driving unit DTU-2 is connected to a fourth node ND4 provided between a plurality of diodes DI1 to Di$n$, and may be electrically connected to a second-$n^{th}$ drain D2-$n$ included in an $n^{th}$ diode DI$n$. That is, a first bottom electrode BML1 illustrated in FIG. 4B may be electrically connected to the second-first drain D2-1 of the first diode DI1, and a second-first bottom electrode BML2-1 may be electrically connected to the second-$n^{th}$ drain D2-$n$ included in the $n^{th}$ diode DI$n$. The driving unit DTU-2 according to one or more embodiments has a circuit configuration in which the first bottom electrode BML1 of the first transistor T1 and the second-first bottom electrode BML2-1 of the first diode DI1 are respectively connected to drain regions of semiconductor patterns of diodes arranged next (e.g., to a drain region of a semiconductor pattern of a respective subsequent diode). Accordingly, it is possible to further enlarge the driving range of a driving unit DTU-2, thereby reducing or preventing the occurrence of spot defects in a low gray level region and the occurrence of non-uniform luminance.

Figure 5A:
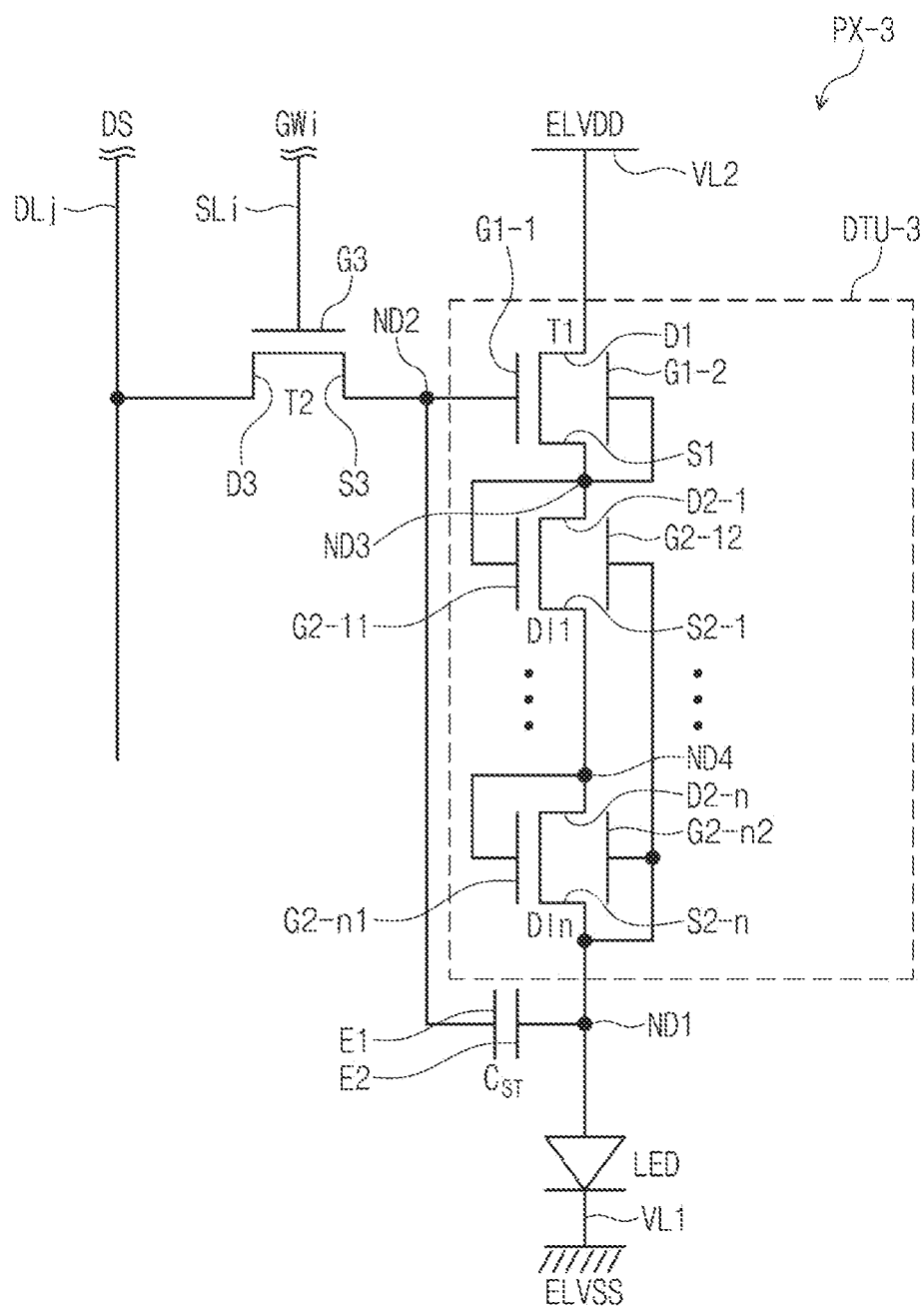
Figure 5B:
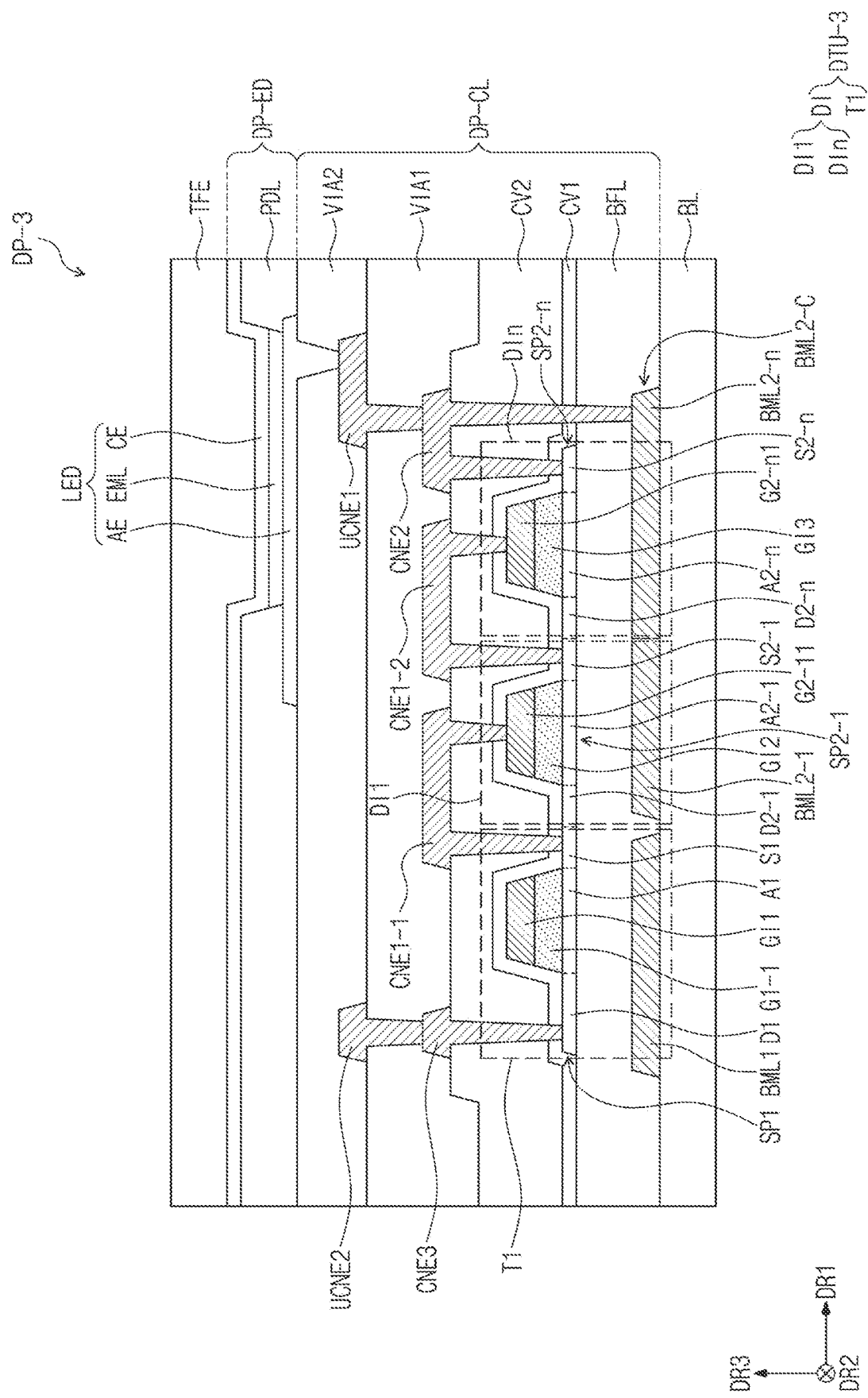

When examining a pixel PX-3 and a display panel DP-3 including a driving unit DTU-3 illustrated in FIGS. 5A and 5B, second lower gates G2-12 and G2-$n$2 included in a plurality of diodes DI1 to DI$n$ may be connected to each other to form an integrated shape. That is, second bottom electrodes BML2-1 and BML2-n, which are included in the plurality of diodes DI1 to DIn illustrated in FIG. 5B, may be connected to each other to form an integrated shape. The second bottom electrodes BML2-1 and BML2-n may be provided as a second common bottom electrode BML2-C having an integrated shape. As the second bottom electrodes BML2-1 and BML2-n may be provided as the second common bottom electrode BML2-C, the same voltage may be applied to bottom electrodes of the plurality of diodes DI1 to DIn.

Figure 6A:
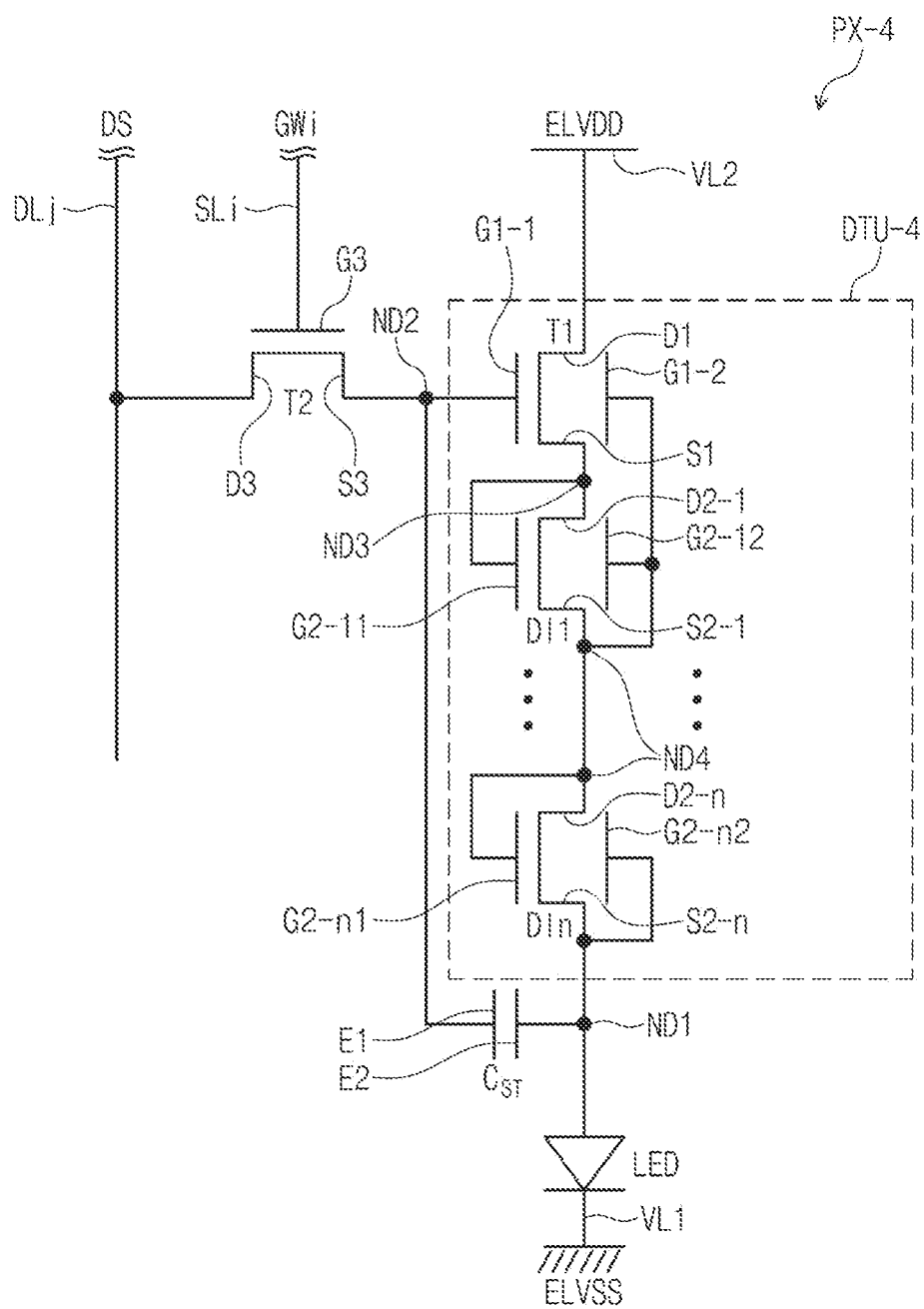
Figure 6B:
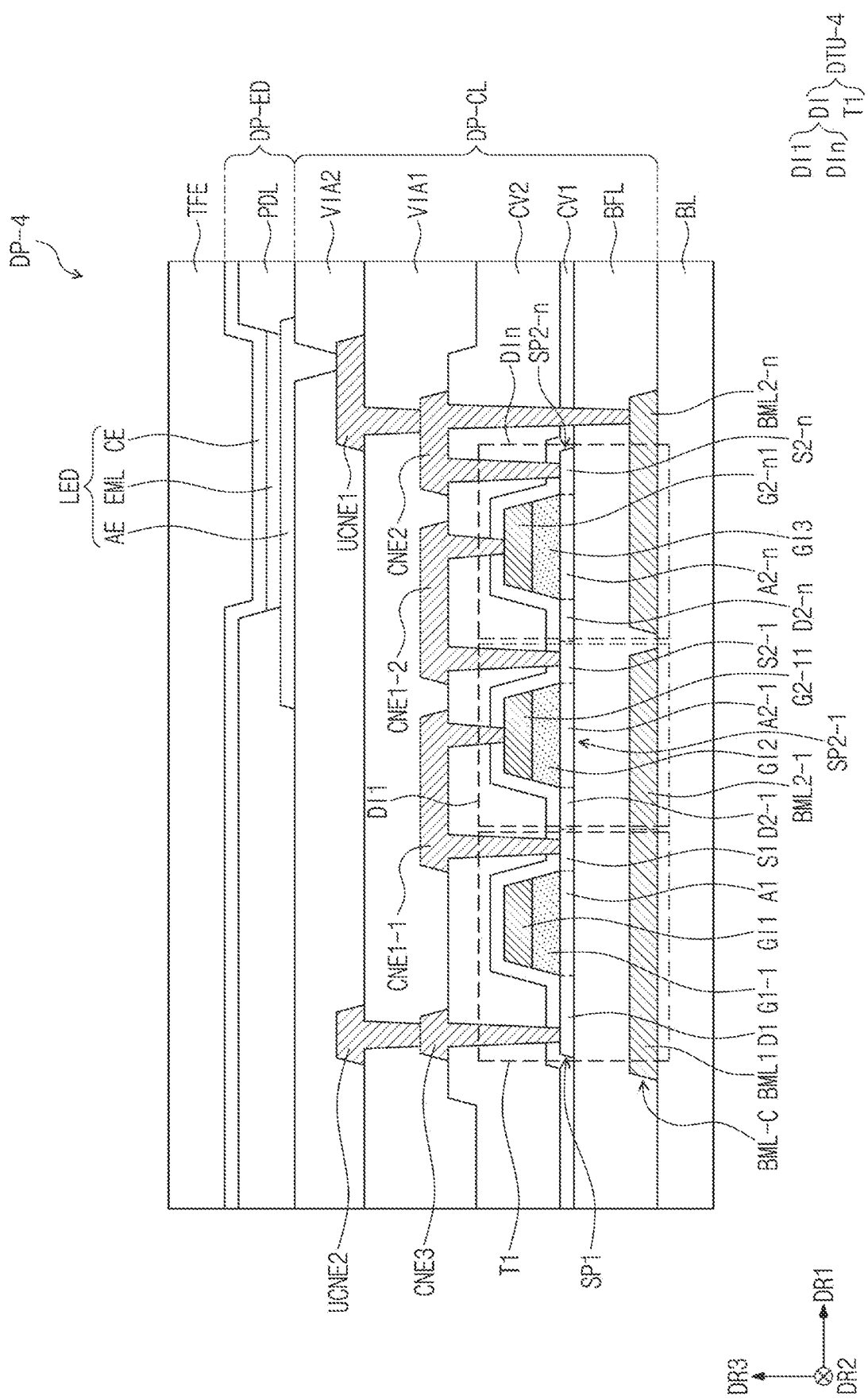

When examining a pixel PX-4 and a display panel DP-4 including a driving unit DTU-4 illustrated in FIGS. 6A and 6B, at least one of second lower gates G2-12 or G2-n2, which are included in a plurality of diodes DI1 to DIn, and a first lower gate G1-2, which is included a first transistor T1, may be connected to each other to form an integrated shape. In one or more embodiments, the second-first lower gate G2-12, which is included in a first diode DI1, and the first lower gate G1-2, which is included in the first transistor T1, may be connected to each other to form an integrated shape. That is, a second-first bottom electrode BML2-1, which is included in the first diode DI1, and a first bottom electrode BML1, which is included in the first transistor T1, may be connected to each other to form an integrated shape. The first bottom electrode BML1 and the second-first bottom electrode BML2-1, which are connected to each other, may be provided as a common bottom electrode BML-C having an integrated shape. As the first bottom electrode BML1 and the second-first bottom electrode BML2-1 are provided as the common bottom electrode BML-C having an integrated shape, the same voltage may be applied to bottom electrodes of the first transistor T1 and the first diode DI1. Also, FIG. 6A illustrates, as an example, a configuration in which the first lower gate G1-2 of the first transistor T1 is connected to only the second-first lower gate G2-12 among the second lower gates G2-12 and G2-n2 of the plurality of diodes DI1 to DIn, but the present disclosure is not limited thereto. The first lower gate G1-2 may be connected to two or more lower gates among the second lower gates G2-12 and G2-n2. That is, the first bottom electrode BML1 and a plurality of bottom electrodes among the second bottom electrodes BML2-1 and BML2-n may be connected to each other to form an integrated shape.

Figure 7A:
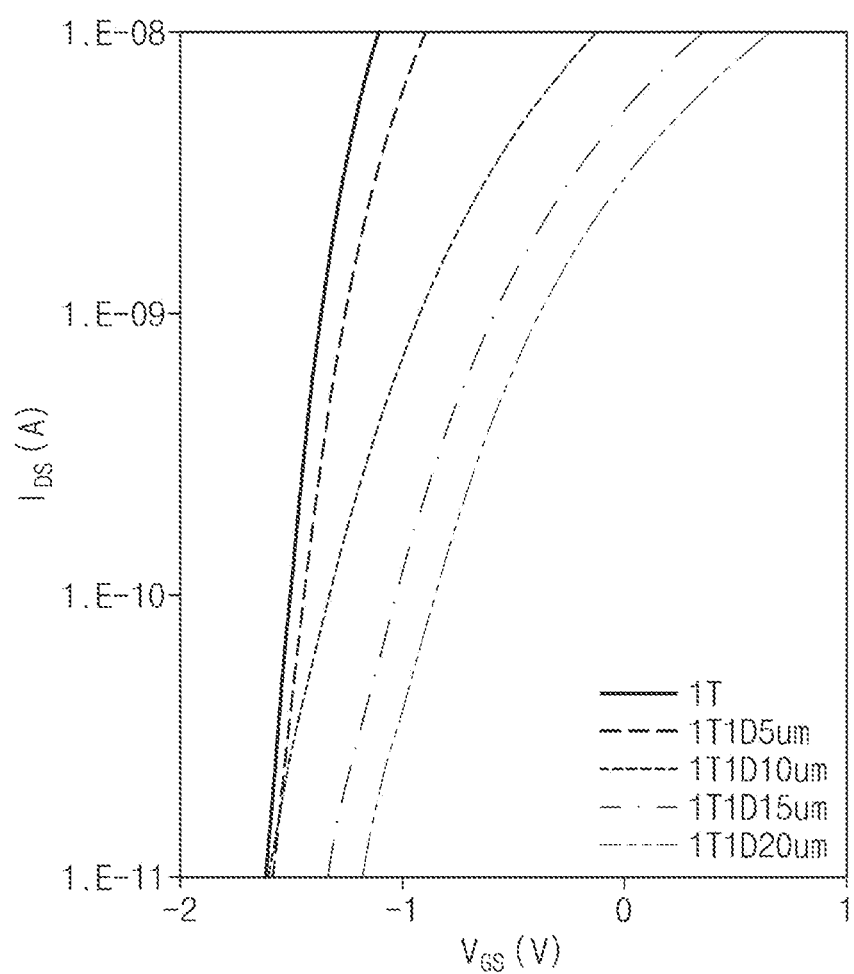
FIGS. 7A and 7B are graphs for comparing the characteristics of a driving unit according to one or more embodiments of the present disclosure with the characteristics of a driving unit according to a comparative example.
Figure 7B:
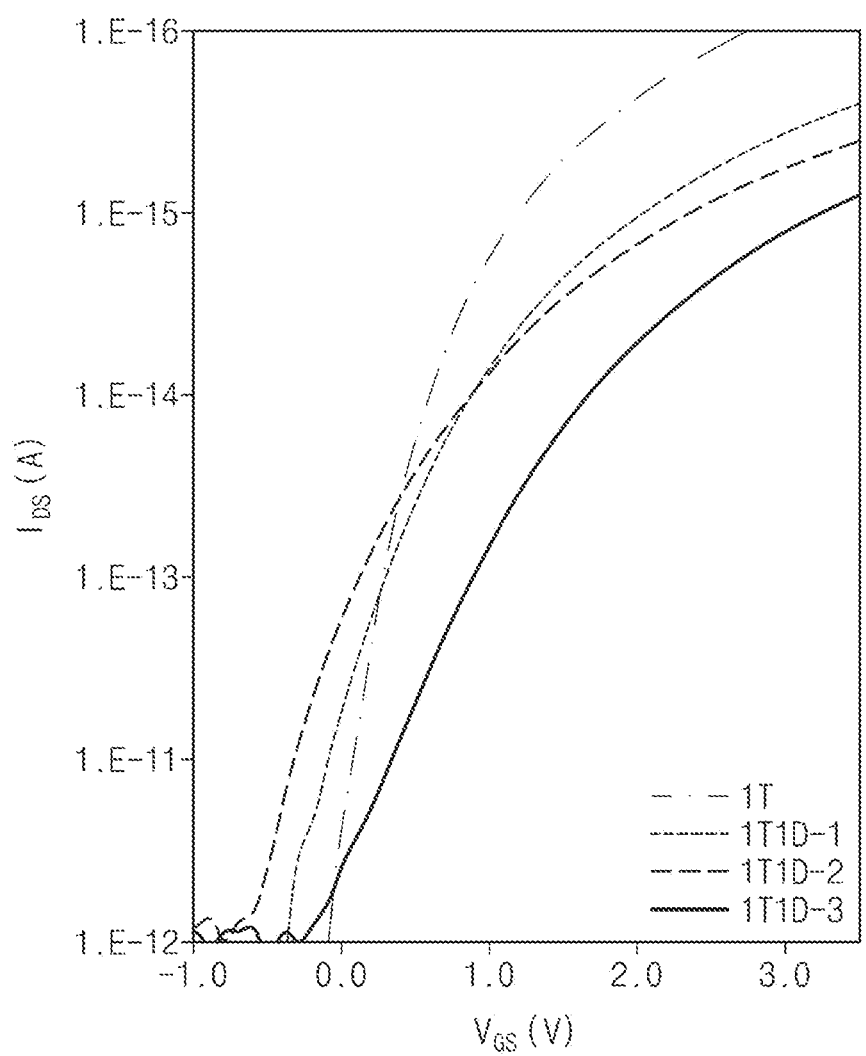

FIGS. 7A and 7B are graphs for comparing the characteristics of a driving unit according to one or more embodiments of the present disclosure with the characteristics of a driving unit according to a comparative example. In each of FIGS. 7A and 7B, a graph indicated by "1T" is a characteristic graph of a driving unit according to the comparative example, and shows a change in the amount of current due to a change in a driving voltage in a driving unit that includes only a first transistor (a driving transistor) without a diode. In each of FIGS. 7A and 7B, a graph indicated by "1T1D" is a characteristic graph of a driving unit according to one or more embodiments, and shows a change in the amount of current due to a change in a driving voltage in a driving unit that includes a first transistor and one diode. Also, as indicated in FIG. 7A, each of the numerical values listed after "1T1D" may indicate the length of a channel region of the diode in one direction. Also, the graph indicated by "1T1D-1" in FIG. 7B has a structure like the driving unit DTU-2 illustrated in FIG. 4A in which the first lower gate G1-2 of the first transistor T1 illustrated in FIG. 4A is connected to the third node ND3 and connected to the second-first drain D2-1 of the first diode DI1. The graph indicated by "1T1D-2" has a structure like the driving unit DTU-4 illustrated in FIG. 6A in which the first lower gate G1-2 of the first transistor T1 has a shape integrated with the second lower gate G2-12 of the first diode DI1. The graph indicated by "1T1D-3" has a structure like a driving unit DTU illustrated in FIG. 2A in which the first voltage $V_{B1}$ and the second voltage $V_{B2}$ are applied to the first lower gate G1-2 of the first transistor T1 and the second lower gate G2-2 of the diode DI, respectively, and the first voltage $V_{B1}$ is equal to the second voltage $V_{B2}$.

When examining FIGS. 7A and 7B, the driving unit according to one or more embodiments may have a greater change in the amount of current due to a change in a driving voltage of the driving unit, compared to the driving unit according to the comparative example. When the change in driving voltage while the amount of current is changed from about 10 pA to about 10 nA is defined as a first driving range DR1, the driving unit according to one or more embodiments has a greater first driving range DR1 than the driving unit according to the comparative example. As illustrated in FIG. 7A, the driving unit according to the comparative example has a first driving range DR1 of about 0.522 V, but the driving units according to the embodiments have first driving ranges DR1 of about 0.696 V, about 1.485 V, about 1.704 V, and about 1.852 V depending on the lengths of the diodes. Also, as illustrated in FIG. 7B, it may be confirmed that the driving unit including the diode shows a greater change in the amount of current due to a change in driving voltage than the driving unit not including the diode according to the comparative example, and thus has a higher first driving range DR1.

Figure 8A:
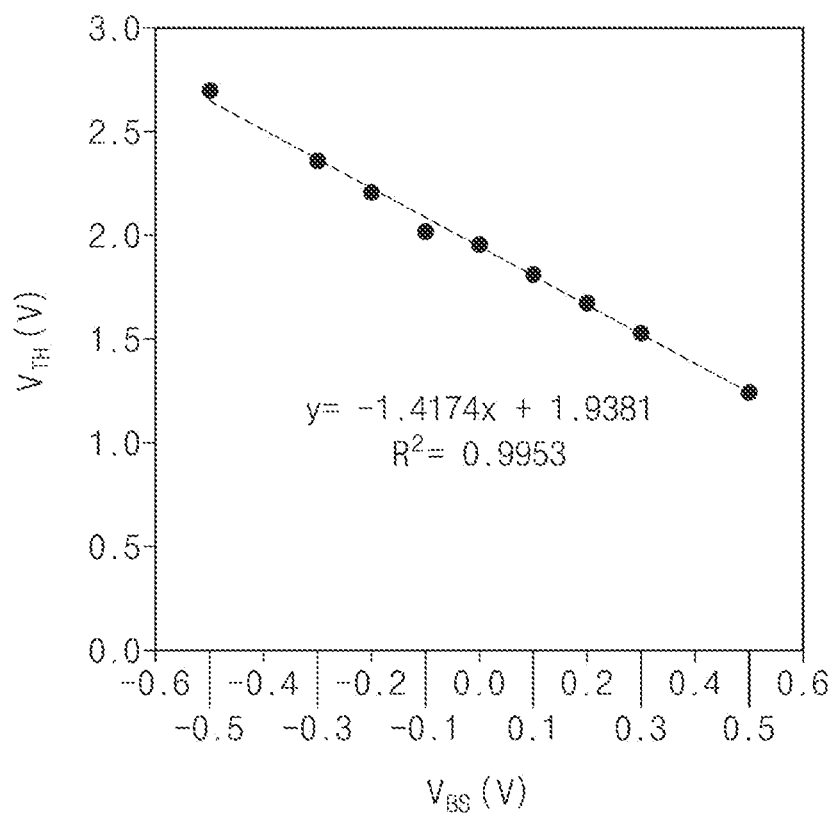
FIGS. 8A and 8B are graphs showing the characteristics of a driving unit according to one or more embodiments.
Figure 8B:
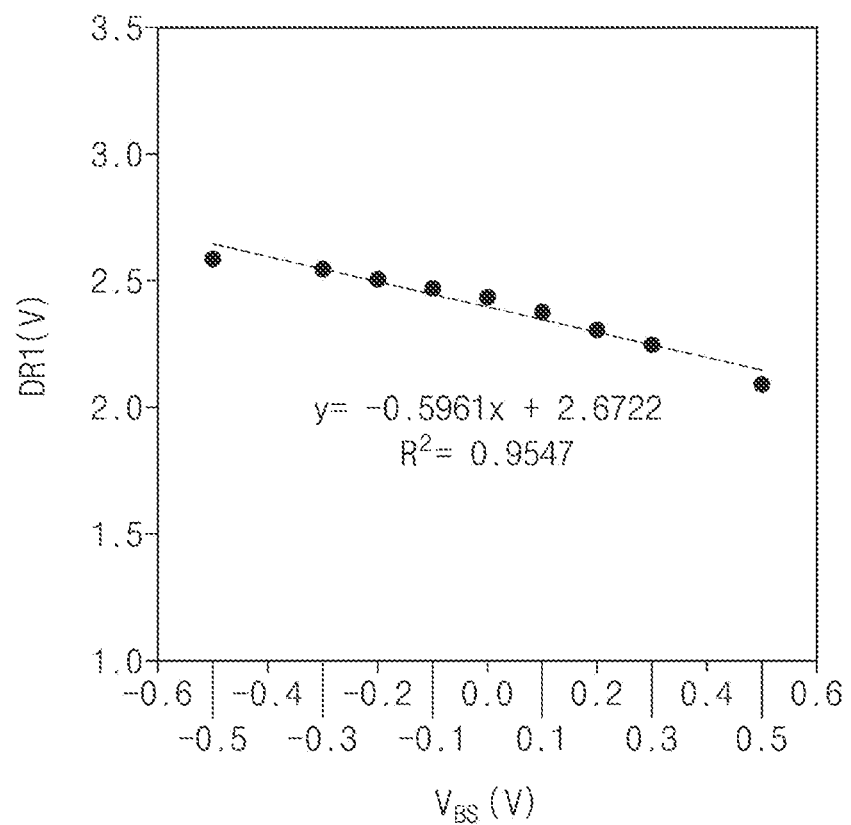

FIGS. 8A and 8B are graphs showing the characteristics of a driving unit according to one or more embodiments. FIG. 8A is a graph showing a change in threshold voltage due to changes in first and second voltages applied to a bottom electrode in a driving unit according to one or more embodiments. FIG. 8B is a graph showing a change in first driving range due to changes in first and second voltages applied to a bottom electrode in a driving unit according to one or more embodiments.

When examining FIGS. 8A and 8B, the first driving range DR1 and the threshold voltage of the driving unit according to one or more embodiments may be regulated by changing the first and second voltages applied to the bottom electrode of the driving unit. Accordingly, it is possible to reduce or prevent the spot defects in the low gray level region, and to reduce or prevent the non-uniform luminance. Also, with a simple method of regulating the voltage applied to the bottom electrode, it is possible to secure the driving range and the threshold voltage required for the driving unit and the display panel including same.

The transistors included in the pixel circuit according to one or more embodiments of the present disclosure include metal oxides, and thus, electron mobility may be relatively high, and a leakage current may be reduced.

The pixel circuit according to one or more embodiments of the present disclosure includes at least one diode connected to a driving transistor. Also, the diode includes a bottom electrode, which is located on the same layer as a bottom electrode of the driving transistor and to which a certain voltage is applied. Accordingly, it is possible to enlarge a driving range in a low gray level region, and to regulate the driving range and a threshold voltage, thereby reducing or preventing the occurrence of spot defects in the low gray level region and reducing or preventing non-uniform luminance.

Although the present disclosure has been described with reference to embodiments of the present disclosure, it will be understood that various changes and modifications of the present disclosure may be made by one skilled in the art or one having ordinary knowledge in the art without departing from the spirit and technical field of the present disclosure as hereinafter claimed. Hence, the technical scope of the present disclosure is to be determined by the following claims, with functional equivalents thereof to be included therein, and should not be limited by the foregoing description.

What is claimed is:

1. A display panel comprising:
   a light-emitting element; and
   a pixel circuit electrically connected to the light-emitting element, and comprising a driving unit electrically connected to the light-emitting element, the driving unit comprising:
      a first transistor comprising a first bottom electrode for receiving a first voltage, and a first semiconductor pattern comprising an oxide semiconductor above the first bottom electrode; and
      at least one diode comprising a second bottom electrode for receiving a second voltage at a same layer as the first bottom electrode, and a second semiconductor pattern above the second bottom electrode, at a same layer as the first semiconductor pattern, comprising an oxide semiconductor, and integrated with the first semiconductor pattern.

2. The display panel of claim 1, wherein the first bottom electrode is electrically connected to the second semiconductor pattern.

3. The display panel of claim 1, wherein the first bottom electrode is spaced from the second bottom electrode.

4. The display panel of claim 1, wherein the at least one diode comprises:
   a first diode comprising a second-first bottom electrode for receiving a second-first voltage at the same layer as the first bottom electrode, and a second-first semiconductor pattern comprising an oxide semiconductor above the second-first bottom electrode and at the same layer as the first semiconductor pattern; and
   an $n^{th}$ diode comprising a second-$n^{th}$ bottom electrode for receiving a second-$n^{th}$ voltage at the same layer as the first bottom electrode, and a second-$n^{th}$ semiconductor pattern comprising an oxide semiconductor above the second-$n^{th}$ bottom electrode and at the same layer as the first semiconductor pattern.

5. The display panel of claim 4, wherein the second-first bottom electrode is integrated with the second-$n^{th}$ bottom electrode.

6. The display panel of claim 4, wherein the second-first voltage is equal to the second-$n^{th}$ voltage.

7. The display panel of claim 1, wherein the first bottom electrode is integrated with the second bottom electrode.

8. The display panel of claim 1, wherein the first transistor comprises a first insulating pattern above the first semiconductor pattern, and a first gate electrode above the first insulating pattern, and
   wherein the at least one diode comprises a second insulating pattern above the second semiconductor pattern, and a second gate electrode above the second insulating pattern.

9. The display panel of claim 8, wherein the first semiconductor pattern comprises a first source region, a first drain region, and a first channel region,
   wherein the first insulating pattern overlaps the first channel region, but does not overlap the first source region and the first drain region,
   wherein the second semiconductor pattern comprises a second source region, a second drain region, and a second channel region, and
   wherein the second insulating pattern overlaps the second channel region, but does not overlap the second source region and the second drain region.

10. The display panel of claim 9, wherein an extension length of the first channel region in a first direction is less than an extension length of the second channel region in the first direction.

11. The display panel of claim 9, wherein the first source region is electrically connected to the second drain region and to the second gate electrode.

12. The display panel of claim 9, wherein the pixel circuit further comprises a first connection electrode connected to the first source region and to the second gate electrode.

13. The display panel of claim 1, wherein the second bottom electrode and the second semiconductor pattern are electrically connected to the light-emitting element.

14. The display panel of claim 1, wherein the first voltage is equal to the second voltage.

15. The display panel of claim 1, wherein the pixel circuit further comprises:
   at least one cover insulating layer configured to cover the first transistor and the at least one diode; and
   a connection electrode above the cover insulating layer, passing through at least a portion of the cover insulating layer, and connected to the driving unit.

16. The display panel of claim 1, wherein the light-emitting element comprises:
   a first electrode electrically connected to the driving unit;
   a second electrode above the first electrode; and
   a light-emitting layer between the first electrode and the second electrode.

17. The display panel of claim 1, wherein the pixel circuit further comprises a second transistor comprising a third semiconductor pattern comprising an oxide semiconductor at the same layer as the first semiconductor pattern and spaced from the first semiconductor pattern.

18. A display panel comprising:
   a light-emitting element; and
   a pixel circuit electrically connected to the light-emitting element, and comprising a first circuit unit electrically connected to the light-emitting element and comprising:
      a first transistor comprising a first bottom electrode for receiving a first voltage, and a first semiconductor pattern comprising an oxide semiconductor above the first bottom electrode; and
      at least one diode comprising a second bottom electrode for receiving a second voltage, electrically connected to the light-emitting element, and at a same layer as the first bottom electrode, and a second semiconductor pattern comprising an oxide semiconductor, electrically connected to the light-emitting element, and located above the second bottom electrode and at a same layer as the first semiconductor pattern.

19. The display panel of claim 18, wherein the first semiconductor pattern comprises a first source region, a first drain region, and a first channel region,
   wherein the second semiconductor pattern comprises a second source region, a second drain region electrically connected to the first source region, and a second channel region.

20. A display panel comprising:
   a light-emitting element; and a pixel circuit electrically connected to the light-emitting element, and comprising a first circuit unit electrically connected to the light-emitting element, the first circuit unit comprising:
- a first transistor comprising a first bottom electrode for receiving a first voltage, and a first semiconductor pattern comprising an oxide semiconductor above the first bottom electrode; and
- at least one diode comprising a second bottom electrode for receiving a second voltage at a same layer as the first bottom electrode, and a second semiconductor pattern comprising an oxide semiconductor above the second bottom electrode at a same layer as the first semiconductor pattern, wherein the first bottom electrode is electrically connected to the second bottom electrode or to the second semiconductor pattern.

\* \* \* \* \*